(12) United States Patent
Ohhashi

(10) Patent No.: US 6,586,815 B2
(45) Date of Patent: Jul. 1, 2003

(54) SEMICONDUCTOR DEVICE HAVING DUMMY INTERCONNECTION AND METHOD FOR MANUFACTURING THE SAME

(75) Inventor: Hajime Ohhashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/006,407

(22) Filed: Nov. 30, 2001

(65) Prior Publication Data

US 2002/0050646 A1 May 2, 2002

Related U.S. Application Data

(62) Division of application No. 09/199,689, filed on Nov. 25, 1998, now abandoned.

(30) Foreign Application Priority Data

Nov. 27, 1997 (JP) .............................................. 9-326584

(51) Int. Cl.⁷ ........................ H01L 29/00; H01L 23/58; H01L 23/62; H01L 21/82; H01L 21/44
(52) U.S. Cl. ...................... 257/529; 257/530; 257/665; 438/130; 438/131; 438/132; 438/601; 438/662
(58) Field of Search ................................. 257/529, 665, 257/758, 530, 910; 438/132, 131, 130, 601, 467, 662, 798, 926

(56) References Cited

U.S. PATENT DOCUMENTS

| | | | |
|---|---|---|---|
| 5,604,156 A | 2/1997 | Chung et al. ............... | 437/195 |
| 5,757,060 A | 5/1998 | Lee et al. .................... | 257/529 |
| 6,054,339 A | 4/2000 | Gilmour et al. ............ | 438/132 |
| 6,057,221 A | 5/2000 | Bernstein et al. .......... | 438/601 |

FOREIGN PATENT DOCUMENTS

| | | |
|---|---|---|
| JP | 63-132449 | 6/1988 |
| JP | 5-152447 | 6/1993 |
| JP | 6-53219 | 2/1994 |
| JP | 08-213465 | 8/1996 |
| JP | 08-236631 | 9/1996 |

OTHER PUBLICATIONS

Examiner Yoichi Ohshima "Notice of Reasons for Refusal" (Office Action) Jun. 4, 2002.

Primary Examiner—Olik Chaudhuri
Assistant Examiner—Neal Berezny
(74) Attorney, Agent, or Firm—Hogan & Hartson, LLP

(57) ABSTRACT

A semiconductor device having an array of dummy interconnections in a fuse window are proposed. The each dummy interconnection comprised of a fuse body scheduled to be blown away by laser beam, a fuse wiring extended up to the bottom of the fuse body from one side of the fuse window, and another fuse wiring extended up to the bottom of the fuse body form the another side of the fuse window. Contact plugs are disposed on terminal portions of the fuse wirings respectively, the terminal portions facing to each other having a predetermined gap between them. The bottom surfaces of both terminal portions of the fuse body are electrically connected with the facing terminal portions of the fuse wirings through the contact plugs, respectively. The length of the fuse body is set so as to have a length not shorter than the predetermined gap and not exceeding a diameter of laser beam to blow off the fuse body.

4 Claims, 18 Drawing Sheets

SEMICONDUCTOR DEVICE HAVING DUMMY INTERCONNECTION AND METHOD FOR MANUFACTURING THE SAME

This is a divisional application of application Ser. No. 09/199,689 filed on Nov. 25, 1998, now abandoned which application is hereby incorporated by reference in its entirety.

BACKGROUND OF THE INVENTION

1. Field of the Invention

The present invention relates to a semiconductor device having dummy interconnections, and particularly to a structure of a dummy interconnection having a fuse body in the semiconductor device using multi-level wiring technology and a method for manufacturing the same.

2. Description of the Related Art

In recent years, according to an increasing capacity of memory, the requirement for the dummy interconnections, or "a fuse circuit" comprising an array of dummy interconnections, each having a fuse body is growing, and the number of the dummy interconnections (fuse bodies) are swelling year by year. Therefore, an occupying space for the fuse area is also enlarged in a semiconductor chip year by year, and a yield of the product is much influenced by whether or not the required fuse bodies are successfully and selectively blown off.

FIG. 1B and FIG. 1A show examples of conventional dummy interconnection structures. FIG. 1A is a schematic plan view, and FIG. 1B is the sectional view of an array of dummy interconnections, or "the fuse circuit" taken along the line IB—IB in FIG. 1A. As shown in FIG. 1B, insulating layers 5, 6 are formed on a silicon substrate 7, between which a fuse body 2 is arranged. Both longitudinal terminal portions of the fuse body 2 are connected with fuse wirings 3a, 3b via contact plugs 4a, 4b of conductive materials, and there is electrical connection between the longitudinal terminal portions of the fuse body and the fuse wiring 3a, 3b. A fuse window 1, which facilitates to blow the fuse body 2, is formed at the top surface of and in the insulating layer 5. When a given fuse body is irradiated with an laser beam through this fuse window, the irradiated fuse body is blown away, and the electrical connection between the ends of the fuse and the fuse wiring 3a, 3b are brought out of conduction.

Further, FIG. 2A and FIG. 2B show a second conventional example, or other conventional dummy interconnection structures. FIG. 2A shows a schematic plan view of this fuse circuit, and FIG. 2B shows the sectional view of the fuse circuit taken along the line IIB—IIB in FIG. 2A. Here, the same markings are given to the parts corresponding to those in the previous conventional example (first conventional example) shown in FIGS. 1A and 1B. In this second conventional example, to reduce the fuse area, the fuse pitch "p" is not only narrowed (however, the fuse pitch "p" in FIG. 2B are drawn at the same pitch as in FIG. 1A, for convenience), but widened blow areas 8a are also provided to make the heat of the laser beam to be concentrated thereon and these parts are arranged in a staggered configuration. Such a configuration is proposed so as make possible to selectively blow off the desired fuse bodies in the blow area 8a and also to reduce the fuse pitch "p" between adjacent fuse bodies, thereby reducing the fuse area. Here, "the fuse area" means the area in which the fuse circuit is formed.

However, the first conventional dummy interconnection configuration shown in FIG. 1A and FIG. 1B had a problem that the heat of the laser beam is transported away in the longitudinal direction of the fuse body 2 because the fuse body 2 is comprised of a slim and linear electric conductor.

Also, the second conventional dummy interconnection configuration shown in FIG. 2A and FIG. 2B may have caused damage to adjacent fuse bodies supposed to be not blown off with a very high possibility, this has been a factor of decrease in the manufacturing yield.

SUMMARY OF THE INVENTION

An object of the present invention is to provide a semiconductor device allowing fuse bodies to be efficiently and easily blown off without conducting away the heat of laser beam.

Another object of the present invention is, when a fuse body is blown away, to provide a semiconductor device permitting a yield-enhancement without exerting influence on the other fuse bodies scheduled to be not blown.

A further object of the present invention is to provide a semiconductor device with dummy interconnections hardly causing damage to a part which is not irradiated with light even if pitch is narrowed between the fuse bodies.

Another object of the present invention is to provide a semiconductor device permitting to achieve a reduction in a fuse area.

Another object of the present invention is to provide a semiconductor device permitting to easily change a shape of a fuse area and enhance a selectivity and a degree of freedom in arrangements of other circuits in the surroundings of the fuse area.

A further object of the present invention is to provide a method of manufacturing a semiconductor device permitting to easily blow fuse bodies.

An even further object of the present invention is to provide a method of manufacturing a semiconductor device permitting to enhance a manufacturing yield at a time of fuse-blowing.

A first feature of the present invention lies in a semiconductor device having a plurality of dummy interconnections permitting to be selectively disconnected by using laser beam for blowing off fuse bodies. Namely, each dummy interconnection comprising: a first fuse wiring having a first terminal portion; a second fuse wiring having a second terminal portion with a given distance apart from the first terminal portion, being arranged along the same direction as the first fuse wiring is extending; a first connecting member arranged on the first terminal portion; a second connecting member arranged on the second terminal portion; and a fuse body arranged on the first and second connecting members so as to electrically connect the first and second connecting members with each other, having a length not shorter than the given distance and not exceeding a diameter of laser beam used for blowing off the fuse body.

According to the first feature of the present invention, the heat caused by irradiation of the laser beam used for selectively bringing specific dummy interconnections into a disconnected state is not transported away by conduction in the longitudinal direction of the first and second fuse wiring. Further, a possibility becomes low for the light irradiation to cause damage to adjacent fuse bodies scheduled to be not blown, and even if pitch between the fuse bodies is narrowed, a possibility to cause damage to non-irradiated part becomes low. Especially, since it is also possible for the fuse bodies to be two-dimensionally positioned at each vertex of a regular triangle, all the fuse bodies can be kept at an equal interval to other most adjacent fuse bodies. Further, it is also possible to reduce fuse pitch with a minimum fuse-to-fuse distances kept equal. Therefore, high-integration of fuse bodies is achievable without causing damage to adjacent fuse bodies.

A second feature of the present invention lies in a semiconductor device which has a fuse area comprised of a guard ring arranged in the peripheral part of the fuse area; fuse windows arranged within the guard ring; a plurality of dummy interconnections traversing the guard ring and fuse windows. And specific dummy interconnections in the fuse area can be selectively blown away to bring them into a disconnected state. Namely, each dummy interconnection comprising: a first fuse wiring having a first terminal portion; a second fuse wiring having a second terminal portion with a given distance apart from the first terminal portion, being arranged along the same direction as the first fuse wiring is extending; a first connecting member arranged on the first terminal portion; a second connecting member arranged on the second terminal portion; and a fuse body arranged on the first and second connecting members so as to electrically connect the first and second connecting members with each other, having a length not shorter than the given distance and not exceeding a diameter of laser beam used for blowing off the fuse body.

According to the second feature of the present invention, the heat caused by irradiation of the laser beam used for selectively blowing off to bring specific dummy interconnections in the fuse area into a disconnected state is not transported away by conduction in the longitudinal direction of the first and second fuse wiring. Further, a possibility becomes low for the light irradiation to cause damage to adjacent fuse bodies scheduled to be not blown, and even if pitch between the fuse bodies is scaled down, a possibility to cause damage to non-irradiated part becomes low. Especially, all the fuse bodies can be kept at equal minimum intervals to other most adjacent fuse bodies. Further, it is also possible to reduce fuse pitch with the minimum fuse-to-fuse distances kept equal. Therefore, high-integration of fuse bodies and reduction in fuse area are achievable without causing damage to adjacent fuse bodies. Moreover, since the fuse area can be changed in the shape, a selectivity and a degree of freedom in arrangements of other circuits around the fuse area can be improved.

A third feature of the present invention lies in a semiconductor device having a plurality of fuse areas, each of fuse areas is related to the second feature. As described in the second feature, each fuse area is comprised of a guard ring arranged in the peripheral part of the fuse area; fuse windows arranged within the guard ring; a plurality of dummy interconnections traversing the guard ring and fuse windows. Then, it is possible to selectively blow off specific dummy interconnections in at least one of the plural fuse areas to a disconnected state by using a laser beam. Namely, each dummy interconnection comprising: a first fuse wiring having a first terminal portion; a second fuse wiring having a second terminal portion with a given distance apart from the first terminal portion, being arranged along the same direction as the first fuse wiring is extending; a first connecting member arranged on the first terminal portion; a second connecting member arranged on the second terminal portion; and a fuse body arranged on the first and second connecting members so as to electrically connect the first and second connecting members with each other, having a length not shorter than the given distance and not exceeding a diameter of laser beam used for blowing off the fuse body.

According to the third feature of the present invention, the heat generated by irradiation of the laser beam used for selectively blowing off specific dummy interconnections in the plural fuse areas to bring into a disconnected state is not transported away by conduction in the longitudinal direction of the first and second fuse wiring. Further, a possibility becomes low to cause damage to adjacent fuse bodies scheduled to be not blown, by irradiating selectively a specific fuse with laser beam. Further, even if pitch between the fuse bodies is miniaturized, a possibility becomes low to cause damage to non-irradiated part. Therefore, high-integration of fuse bodies and reduction in fuse area are achievable without causing damage to adjacent fuse bodies. Moreover, since the plural fuse areas can be changed in the shape, a selectivity and a degree of freedom in arrangements of other circuits around the fuse areas can be improved.

A fourth feature of the present invention pertains to a method of manufacturing a semiconductor device which has a plurality of dummy interconnections and is capable of blowing off (a) fuse bodies (body) of specific dummy interconnection(s) by using a laser beam and selectively bringing them (it) into a disconnected state. Namely, the method of manufacturing the semiconductor device related to the fourth feature of the present invention consists of, at least (a) forming a plurality of first fuse wiring, each having first terminal portion and a plurality of second fuse wiring, each having second terminal portion with a given distance apart from the first terminal portion; (b) depositing a first interlayer insulating film on the first and second fuse wirings; (c) making contact holes in the first interlayer insulating film to expose a part of the first and second terminal portions; (d) burying conductive material into the contact holes to form first and second connecting members on the first and second terminal portions, respectively; (e) forming a plurality of fuse bodies, each having side lengths not exceeding a diameter of laser beam on the first and second connecting members so as to electrically connect the first and second connecting members with each other; (f) depositing a second interlayer insulating film on the fuse bodies; (g) forming a concave to provide a fuse window at the surface of and in the second interlayer insulating film; and (h) irradiating laser beam through the fuse window to selectively blow off a specific fuse body among the plurality of fuse bodies.

According to the fourth feature of the present invention, when specific fuse body (or bodies) is (are) irradiated with a laser beam, the heat generated by this irradiation of the laser beam is not transported away by conduction in the longitudinal direction of the first and second fuse wirings. Further, a possibility becomes low to cause damage to fuse bodies of adjacent dummy interconnections by irradiating of laser beam. Therefore, it is possible to enhance a manufacturing yield of a product according to the fourth feature of the present invention. Further, even if pitch between the fuse bodies is made narrow, there is little possibility to cause damage to non-blowing part, therefore, reduction in fuse area and chip size can be achieved. As a result, high-integration of fuse bodies and reduction in a fuse area can easily be achieved without causing damage to adjacent fuse bodies.

Other and further objects and features of the present invention will become obvious upon an understanding of illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Figure 1A:
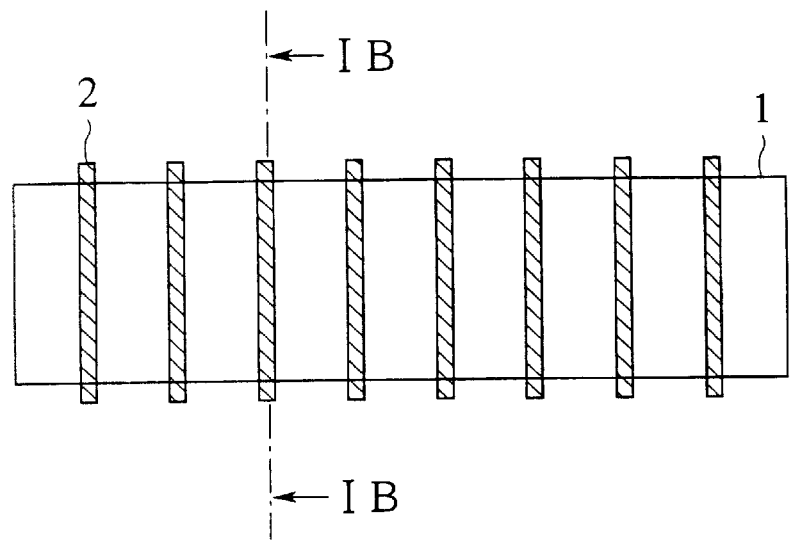
FIG. 1A is a schematic plan view of a conventional fuse circuit.
Figure 1B:
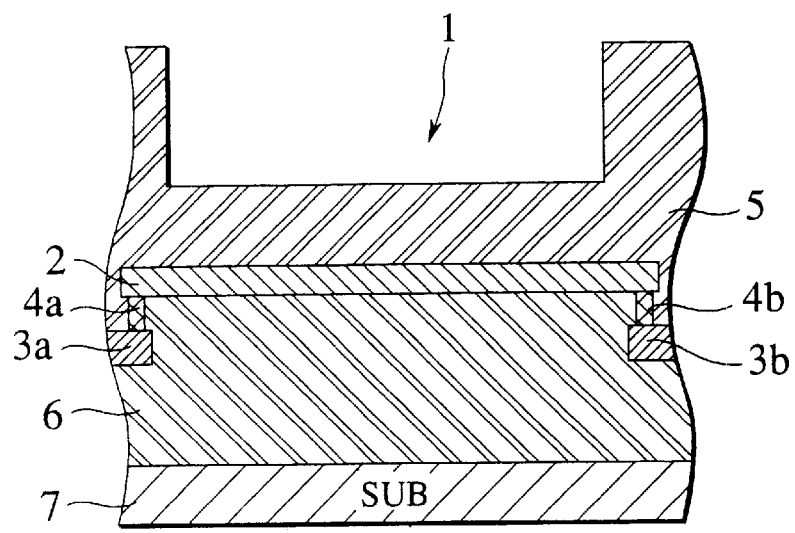
FIG. 1B is a schematic sectional view of a conventional fuse circuit taken along the line IB—IB in FIG. 1A.
Figure 2A:
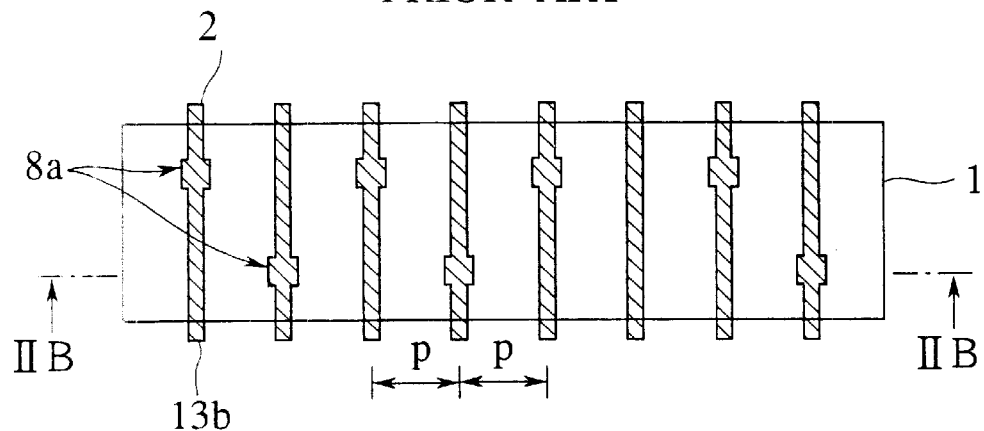
FIG. 2A is a schematic plan view of another conventional fuse circuit.
Figure 2B:
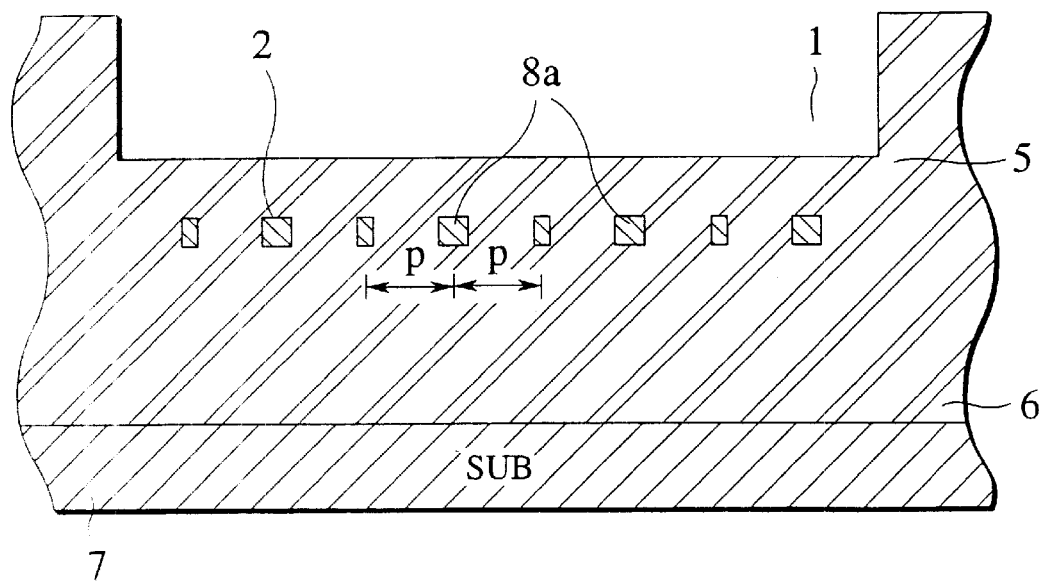
FIG. 2B is a schematic sectional view of another conventional fuse circuit taken along the line B–IIB in FIG. 2A.

Various embodiments of the present invention will be described with reference to the accompanying drawings. It is to be noted that the same or similar reference numerals are applied to the same or similar parts and elements throughout the drawings, and the description of the same or similar parts and drawings, and the description on the same or similar parts and elements will be omitted or simplified.

Generally and as it is conventional in the presentation of semiconductor devices, it will be appreciated that the various drawings are not drawn to scale from one figure to another nor inside a given figure, and in particular that the layer thicknesses are arbitrary for facilitating the reading of the drawings.

First Embodiment

Figure 3A:
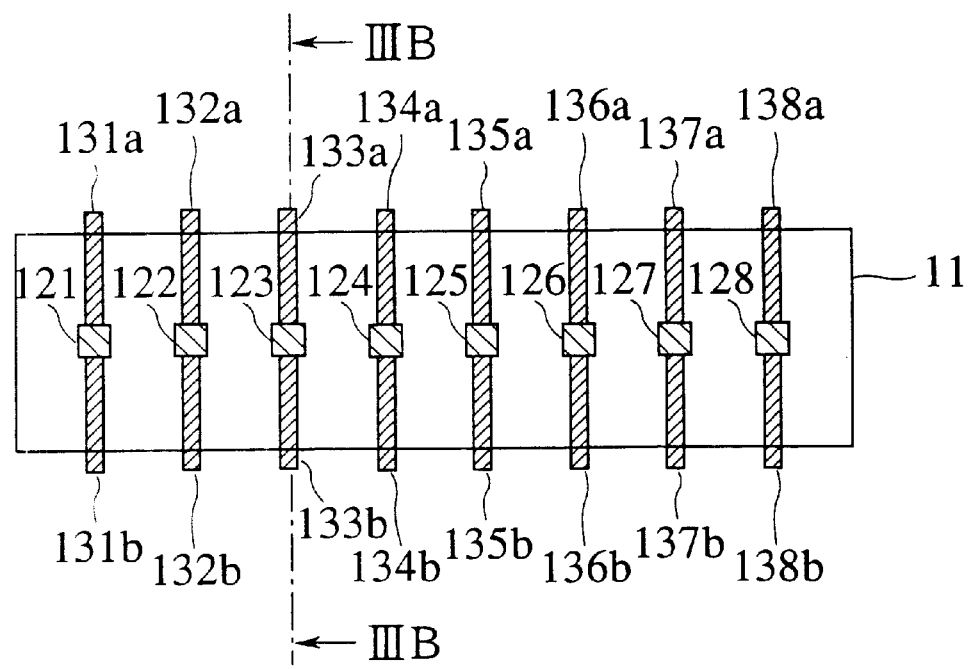
FIG. 3A is a schematic plan view of a fuse circuit of a semiconductor device related to the first embodiment in accordance with the present invention.
Figure 3B:
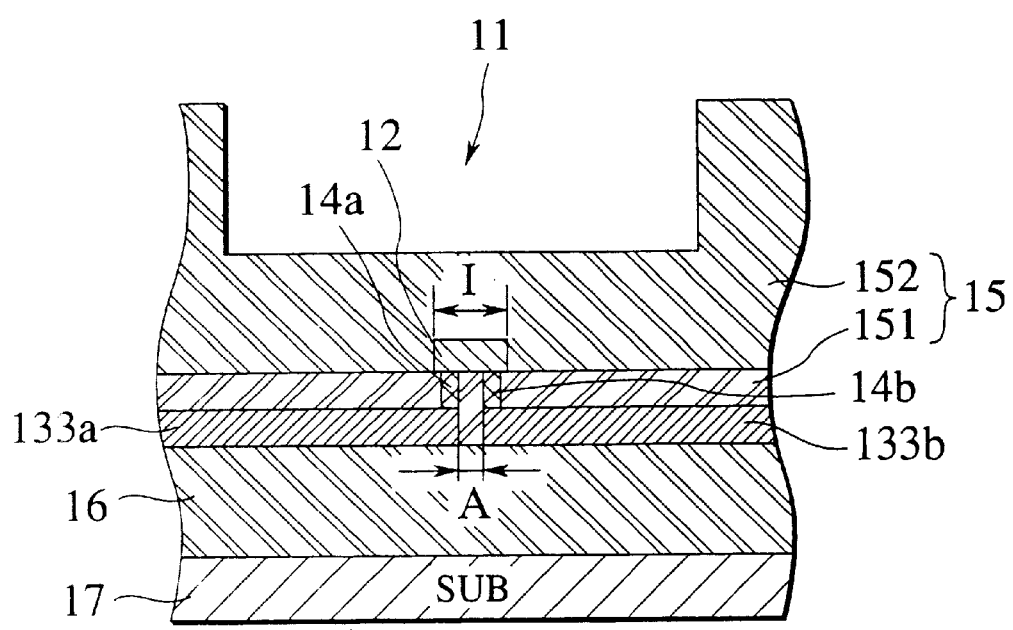
FIG. 3B is a schematic sectional view taken along the line IIIB–IIIB in FIG. 3A.

Referring to FIG. 3A and FIG. 3B, a configuration of dummy interconnections of a semiconductor device related to a first embodiment of the present invention is described. FIG. 3A is a schematic plan view of this array of dummy interconnections or the fuse circuit, and FIG. 3B is a schematic sectional view taken along the line IIIB—IIIB in FIG. 3A.

As shown in FIG. 3A and FIG. 3B, in the configuration of dummy interconnections of the semiconductor device related to the first embodiment of the present invention, an insulating layer 16 is formed on a substrate 17, and a plurality of fuse bodies 121, 122, ..., 128, ... are arranged on the insulating layer 16. On the plurality of fuse bodies 121, 122, ..., 128, ... is arranged an insulating layer 15 comprising interlayer insulating films 151 and 152. The fuse bodies 121, 122, ..., 128, ... are confined in squares whose side is 0.8 $\mu$m to 1 $\mu$m. At the top surface of and in the insulating layer 15, a rectangular fuse window 11 is formed for blowing off the fuse bodies 121, 122, ..., 128, .... A shorter side length of the fuse window 11 is about 10 $\mu$m. Just under the plurality of the fuse bodies, a plurality of first fuse wirings 131a, 132a, ..., 138a, ... and a plurality of second fuse wirings 131b, 132b, ..., 138b, ... are arranged. The interval between each of the first fuse wirings 131a, 132a, ..., 138a, ..., or between each of the second fuse wirings 131b, 132b, ..., 138b, ... is 3.6 $\mu$m. The line width of the first fuse wirings 131a, 132a, ..., 138a, and the fuse wirings 131b, 131b, ..., 138b, ... is 0.8 $\mu$m, respectively.

The fuse wirings 131a, 132a, ..., 138a, ... have the first terminal portions, respectively. On the other hand, the second fuse wirings 131b, 132b ..., 138b, ... have the second terminal portions, respectively. As shown in FIG. 3B, the second terminal portions are apart from the first terminal portions by a given distance "A". The second fuse wirings 131b, 132b, ..., 138b, ... are arranged along the same extended direction of the first fuse wirings 131a, 132a, ..., 138a, ..., respectively.

Among these, the first fuse wirings 131a, 132a, ..., 138a, ... have a length extending from a bottom position just under a sidewall of the concave forming the fuse window 11 up to bottom positions of the fuse bodies 121, 122, ..., 128, ..., and are set to be overlapped under one-terminal portions of the fuse bodies 121, 122, ..., 128, .... Also, the second fuse wirings 131b, 132b, ..., 138b, ... have a length extending from another bottom position just under another sidewall of the concave forming the fuse window 11 up to another bottom positions of the fuse bodies 121, 122, ..., 128, ..., and are set to be overlapped under another terminal portions of the plural fuse bodies 121, 122, ..., 128, .... The fuse wiring 131a facing to the fuse wiring 131b to form a fuse wiring pair (131a, 131b) with the first and second terminal portions spaced by the length "A". Similarly, the fuse wiring 132a facing to the fuse wiring 132b to form another fuse wiring pair (132a, 132b) with the first and second terminal portions spaced by the length "A" . . . . And, the fuse wiring 138a facing to the fuse wiring 138b to form the other fuse wiring pair (138a, 138b) with the first and second terminal portions spaced by the length "A".

Further, each of the bottom surfaces at terminal portions of the fuse bodies 121, 122, ..., 128, ... is connected with each of the top surfaces of the first terminal portions of the first fuse wirings 131a, 132a, ..., 138a, ... via first connecting member (the first contact plug) 14a. Similarly, each of the other bottom surfaces at terminal portions of the fuse bodies 121, 122, ..., 128, ... is connected with each of the top surfaces of second terminal portion of the second fuse wirings 131b, 132b, ..., 138b, ... via second connecting members (the second contact plug) 14b. Then, each of the fuse bodies 121, 122, ..., 128, ... of the semiconductor device related to the first embodiment of the present invention has a dimension of not less than a given distance "A" and not exceeding a diameter of laser beam to blow off at least one of the fuse bodies 121, 122, ..., 128, .... A circular or rectangular beam of laser light having 1 μm to 10 μm of a diameter or a diagonal can be adopted.

In FIG. 3A or FIG. 3B, the first fuse wirings 131a, 132a, ..., 138a, ... and the second fuse wirings 131b, 132b, ..., 138b, ... are arranged with 3.6 μm pitch and each has 0.8 μm line width, therefore, if a laser beam having a diameter or a diagonal line of 6 μm or less, for example, 3.5 μm is adopted, only desired fuse bodies can selectively be blown without exerting influence on the adjacent fuse wirings. Namely, the diameter of the laser beam can be determined considering the pitch and line width of the first fuse wirings 131a, 132a, ..., 138a, ... and the second fuse wirings 131b, 132b, ..., 138b, ....

Thus, the fuse circuit of the semiconductor device related to the first embodiment of the present invention is configured by arranging in parallel a plurality of dummy interconnections consisting of the first fuse wirings 131a, 132a, ..., 138a, ...; the first contact plugs 14a; the fuse bodies 121, 122, ..., 128, ...; the second contact plugs 14b; and the second fuse wirings 131b, 132b, ..., 138b, ....

According to the above-described semiconductor device related to the first embodiment of the present invention, the length of the fuse bodies 121, 122, ..., 128, ... is set to a length not exceeding the diameter of the laser beam, therefore, the heat generated by the laser beam is not transported away via dummy interconnection in its longitudinal direction. Moreover, since the cross sections of the first and second connecting members (the first and second contact plugs) are small, the heat at the time of blowing is also hard to be transmitted to the first fuse wiring 131a, 132a, ..., or 138a, ... and the second conductive wiring 131b, 132b, ..., or 138b.... Therefore, the heat by the laser beam is concentrated on a specific fuse body—at least one of these fuse bodies 121, 122, ..., 128, ...—to blow away, and this structure facilitates fuse-blowing compared with the architecture of the conventional one.

Figure 3C:
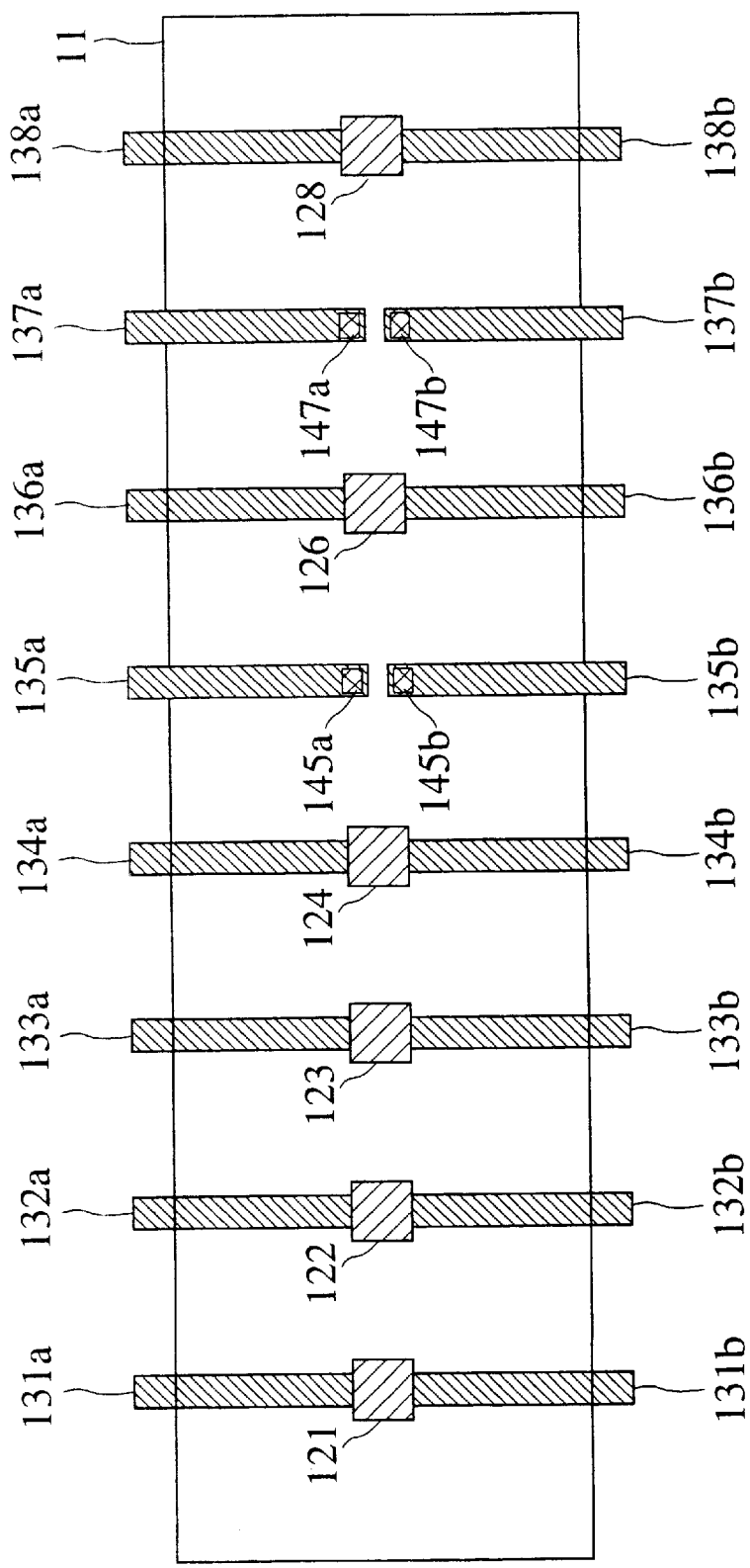
FIG. 3C is a schematic plan view of a fuse circuit of a semiconductor device related to the first embodiment in accordance with the present invention after fuse bodies are blown.

FIG. 3C shows a plan view of the semiconductor device related to the first embodiment of the present invention after fuse-blowing, showing the state in which the elected fuse bodies 125 and 127 among the fuse bodies 121, 122, ..., 128, ... shown in FIG. 3A are blown off, selectively.

As shown in FIG. 3C, it is apparent that the third fuse wirings 135a, 137a and the fourth fuse wirings 135b, 137b are electrically insulated from each other respectively and are in an open state (for convenience, to distinguish the specific fuse wirings from other non-blown fuse wirings, these first and second fuse wirings corresponding to the blown away dummy interconnections are called "the third fuse wiring" and "the fourth fuse wiring", respectively, here). The third fuse wirings 135a, 137a have the third terminal portions, respectively. And, the fourth fuse wirings 135b, 137b have the fourth terminal portions, respectively. Since the third terminal portion corresponds to the non-blown first terminal portions and the fourth terminal portion corresponds to the non-blown second terminal portions, the fourth terminal portion is apart from the third terminal portion by a length "A". On the third terminal portions of the third fuse wirings 135a, 137a, the third connecting members (the third contact plugs) 145a, 147a are exposed. Similarly, on the fourth terminal portions of the fourth fuse wiring 135b, 137b, the fourth connecting members (the fourth contact plugs) 145b, 147b are exposed. The third contact plug 145a and the fourth contact plug 145b are electrically insulated from each other because the fuse body 125 is blown away. Similarly, the third contact plug 147a and the fourth contact plug 147b are electrically insulated from each other because the fuse body 127 is blown away.

As a detailed structure of the dummy interconnection related to the first embodiment of the present invention, for example, such a tri-layer structure can be mentioned as the fuse bodies 121, 122, ..., 128, ... consisting of aluminum alloy (Al—Cu or Al—Cu—Si) with its top and bottom surfaces held by titanium (Ti)/titanium nitride (TiN). Instead of aluminum alloy, Cu or doped poly-silicon can be used. Also, for the first (or the third) fuse wirings 131a, 132a, ..., 138a, ... and the second (or the fourth) fuse wirings 131b, 132b, ..., 138b, ..., tungsten (W) with Ti laid under the bottom surface of the W, etc. can be used. Instead of W, refractory metals such as molybdenum (Mo), cobalt (Co), refractory metal silicides such as $WSi_2$, $MoSi_2$, $CoSi_2$, etc. or polycide comprising these refractory metal silicides are also usable.

For the first or the third connecting members (the first or the third contact plugs) 14a and the second or the fourth connecting members (the second or the fourth contact plugs) 14b, W with TiN laid under the W can be mentioned. Or, the refractory metal such as Mo, Co, refractory metal silicides such as $WSi_2$, $MoSi_2$, $CoSi_2$, etc. or polycide comprising these refractory metal silicides are also usable. By employing these substances, the lower electric resistance can be assured so as not deteriorate the performance of the semiconductor device.

The fuse circuit of the semiconductor device related to the first embodiment of the present invention can be manufactured by the procedures shown in FIG. 4A through FIG. 4H.

Figure 4A:
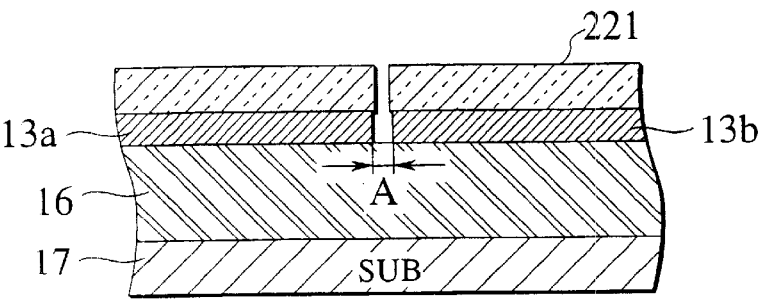
FIG. 4A–FIG. 4H are process sectional views for describing a method of manufacturing the semiconductor device related to the first embodiment of the present invention.

(a) Firstly, an insulating layer 16 of 100 nm to 800 nm thickness, desirably, 300 nm to 400 nm is formed on a silicon substrate 17 by thermal oxidation, etc. The insulating layer 16 may made of silicon oxide film ($SiO_2$), phosphosilicate glass (PSG) film, brophosphosilicate glass (BPSG), or silicon nitride film ($Si_3N_4$), etc. deposited by Chemical Vapor Deposition (CVD). On this insulating layer 16, as shown in FIG. 4A, the first fuse wiring 13a with the first terminal portion and the second fuse wiring 13b, which has the second terminal portion made apart by a given distance "A" from the first terminal portion and is arranged along the same direction as extension of the first fuse wiring 13a, are formed. Although only a pair of fuse wirings consisting of the first fuse wiring 13a and the second fuse wiring 13b is shown in FIG. 4A through FIG. 4H, it is evident that plural pairs are formed on the insulating layer 16. The thickness of the first fuse wiring 13a and the second fuse wiring 13b can be 150 nm to 300 nm, desirably, about 200 nm. These plural pairs consisting of the first and second fuse wirings can be formed at the same time as a metallization process of the first level interconnections (not shown in FIG. 4A) of the memory cell array. To be more specific, a metal layer such as Ti and W are deposited on the insulating layer 16 by sputtering, vacuum evaporation, or CVD, etc. Then, as shown in FIG. 4A, a photoresist mask pattern 221 is formed. And then, this metal layer is delineated by an etching such as the Reactive Ion Etching (RIE), employing the mask pattern 221. After that, the photoresist 221 is removed. Thus, the plural first and second fuse wirings are formed on the insulating layer 16 as plural pairs.

Figure 4B:
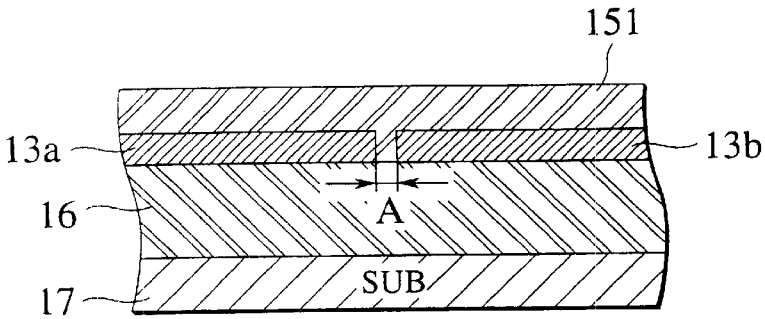

(b) Next, as shown in FIG. 4B, the first interlayer insulating film 151 such as $SiO_2$, PSG, or BPSG film, etc. is deposited on the first and second fuse wiring 13a, 13b by means of CVD method, etc. The thickness of the first interlayer insulating film 151 can be 200 nm to 800 nm, desirably, about 500 nm.

Figure 4C:
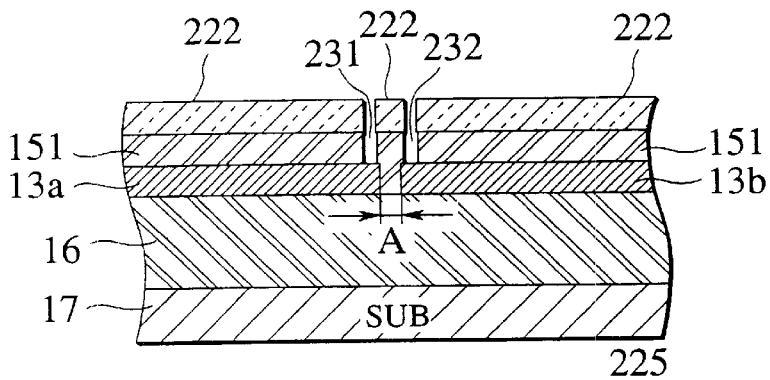

(c) Then, as shown in FIG. 4C, a mask pattern 221 made of photoresist 222 is delineated by means of photolithography. And then, using this mask pattern 222, contact holes 231, 232 are dug in the first interlayer insulating film 151 by RIE method so as to partly expose the first terminal portion of the first fuse wiring 13a and the second terminal portion of the second fuse wiring 13b.

Figure 4D:
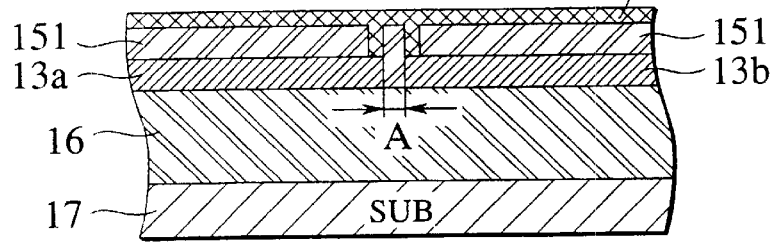

(d) A conductive material is buried into these contact holes 231, 232. Firstly, as shown in FIG. 4D, a thin TiN film is deposited in the bottom and sidewall of the contact holes 231, 232 by means of sputtering, vacuum evaporation, or CVD method, etc., and W film is deposited thereon to form a metallic film 225 so as to excessively bury the contact holes 231, 232. After that, an excess metallic film 225 on the surface of the first interlayer insulating film 151 is removed. Namely, the metallic film 225 is selectively buried in the contact holes 231, 232 by flattening the surface of the first interlayer insulating film 151 by means of back-etching such as the reverse sputtering or chemical mechanical polishing (CMP), etc. As a result, the first connecting member 14a and second connecting member 14b are formed on the first and second terminal portions 13a and 13b respectively.

Figure 4E:
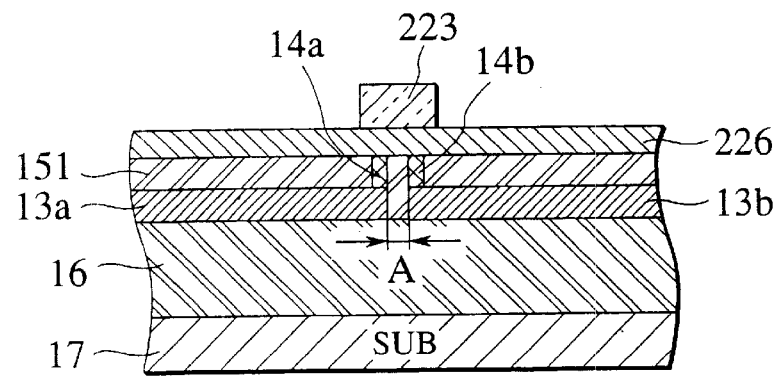

(e) A thin Ti/TiN film is deposited on the surface of the flattened first interlayer insulating film 151, and aluminum alloy (Al—Cu) film is further deposited thereon. Then, another thin Ti/TiN film is further deposited to form a tri-layer metallic film 226 as shown in FIG. 4E. The tri-layer metallic film 226 can be 200 to 500 nm thick, desirably, about 300 nm. The metallic film 226 is allowed to be formed at the same time as a metallization process of the second level interconnections (not shown in FIGS. 4D and 4E) of the memory cell array. Sputtering, vacuum evaporation, or CVD method, etc. can be used for depositing these metal films. Then, a mask pattern of photoresist 223 is coated and delineated by photolithography as shown in FIG. 4E. And then, the metallic film 226 is patterned by RIE method using this mask pattern 223. As a result, a rectangular fuse body 12 having side length equal to or less than a laser beam diameter (to be used in the blown-off process) is formed so as to interconnect the first and second connecting members 14a, 14b mutually, formed on the first and second fuse wirings 13a, 13b, respectively. Although only a single fuse body 12 is shown in FIG. 4F through FIG. 4H, it is evident that plural fuse bodies are formed.

Figure 4F:
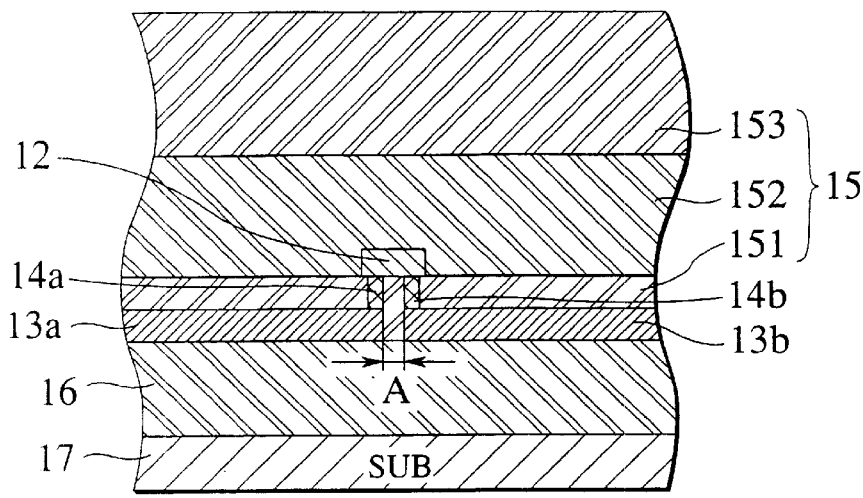

(f) Then, as shown in FIG. 4F, a second interlayer insulating film 152 such as $SiO_2$, PSG, BPSG, or $Si_3N_4$ film, etc. is deposited by CVD method, etc. on the fuse body 12. Further, third level interconnections (not shown in FIG. 4F) for the memory cell array are formed on this second interlayer insulating film 152. Then, further thereon, a third interlayer insulating film 153 such as $SiO_2$, PSG, BPSG, or $Si_3N_4$ film is deposited by CVD method, etc. A total thickness of the second and third interlayer insulating films 152, 153 is allowed to be 800 nm to 2 $\mu$m, desirably, about 1.5 $\mu$m.

Figure 4G:
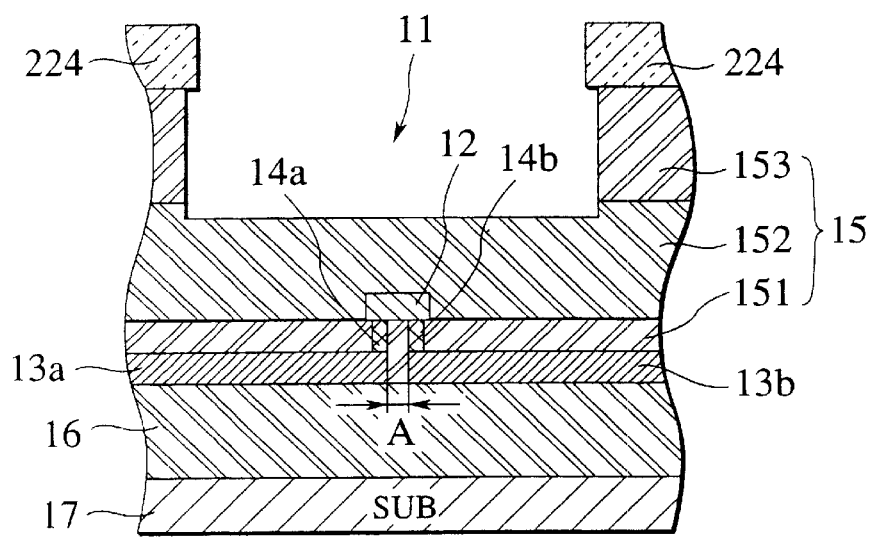
Figure 4H:
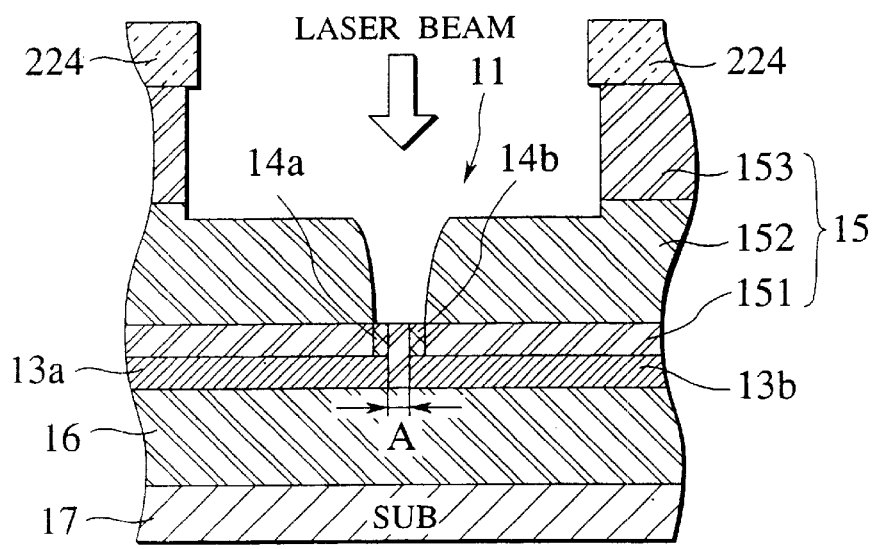

(g) As shown in FIG. 4G, a mask pattern of polyimide 224 is delineated by photolithography. And then, a concave shaped fuse window 11 is formed by selectively etching the third and second interlayer insulating films 153, 152 by RIE method using the polyimide 224 as a mask so that the thickness of the second interlayer insulating film 152 becomes 0 nm to 400 nm, desirably, 150 nm.

(h) After that, the memory cells are tested to determine whether and which dummy interconnection(s) is(are) required to be blown off. Then, the fuse(s) 12 determined to be blown off is(are) selectively irradiated through the fuse window 11 with laser beam such as YLF laser, YAG laser, excimer laser, etc. For example, if the fuse body is irradiated with YLF laser beam having wavelengths of 1.321 $\mu$m or 1.047 $\mu$m and a beam diameter of 3.5 $\mu$m to 6 $\mu$m, the fuse body 12 and the second interlayer insulating film 152 irradiated with the laser beam are selectively melted and evaporated away as shown in FIG. 4H. Thus, only a particular fuse body 12 can selectively be removed.

Figure 5A:
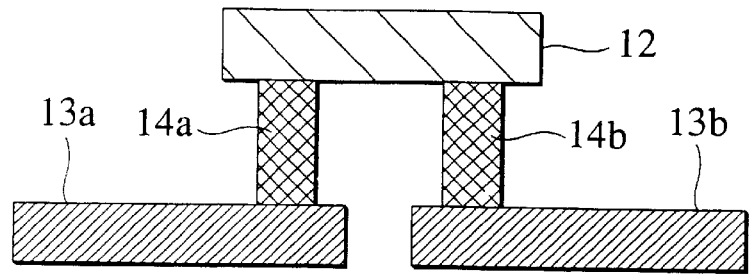
FIG. 5A is a schematic sectional view showing another example of the configuration around the fuse body.
Figure 5B:
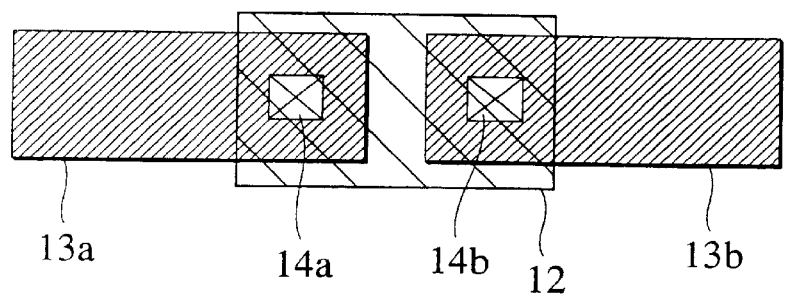
FIG. 5B is a schematic plan view corresponding to the sectional view shown in FIG. 5A.

FIG. 5A and FIG. 5B illustrate another example of the structure of the dummy interconnection related to the first embodiment of the present invention. FIG. 5A is a schematic cross sectional view of the structure around the fuse body and FIG. 5B is a schematic plan view of the same part. Although the fuse body 12 shown in FIG. 3A is formed about in a square, or a regular tetragon, it can be formed also in a rectangle having long sides arranged in the extended direction of the first and second fuse wirings 13a and 13b as shown in FIG. 5A and FIG. 5B.

Figure 6A:
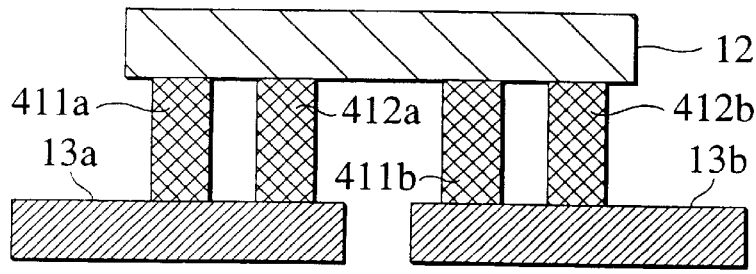
FIG. 6A is a schematic sectional view showing still another example of the configuration around the fuse body.
Figure 6B:
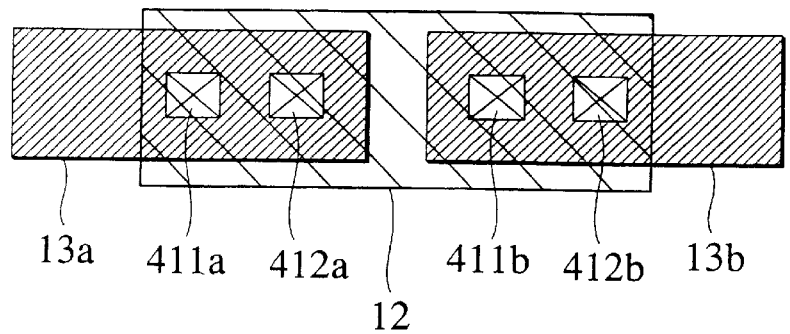
FIG. 6B is a schematic plan view corresponding to the sectional view shown in FIG. 6A.

FIG. 6A and FIG. 6B illustrate further another example of the structure of the dummy interconnection related to the first embodiment of the present invention. FIG. 6A is a schematic cross sectional view of the structure around the fuse body and FIG. 6B is a schematic plan view of the same part. In the structures shown in FIGS. 3A–3B and FIGS. 5A–5B, the terminal portions of the first and second fuse wiring 13a, 13b are provided with a single contact plugs 14a, 14b, respectively. But, the first and second contact plugs may be doubled (or more) for each terminal portions. Namely, as shown in FIG. 6A and FIG. 6B, a plurality of first connecting members 411a, 412a, . . . can be arranged on first terminal portion, and a plurality of second connecting members 411b, 412b, . . . can be arranged on the second terminal portion. The first connecting members 411a, 412a, . . . and the second connecting members 411b, 412b, . . . are arranged in the extended direction of the first and second fuse wirings 13a and 13b.

Figure 7A:
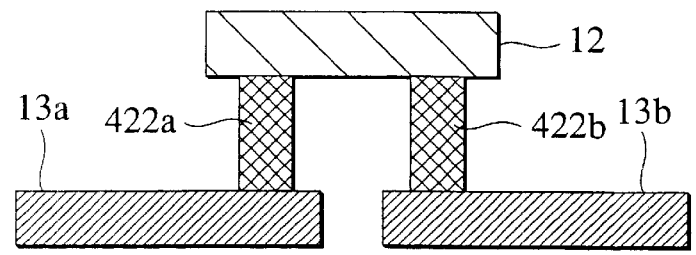
FIG. 7A is a schematic sectional view showing still another example of the configuration around the fuse body.
Figure 7B:
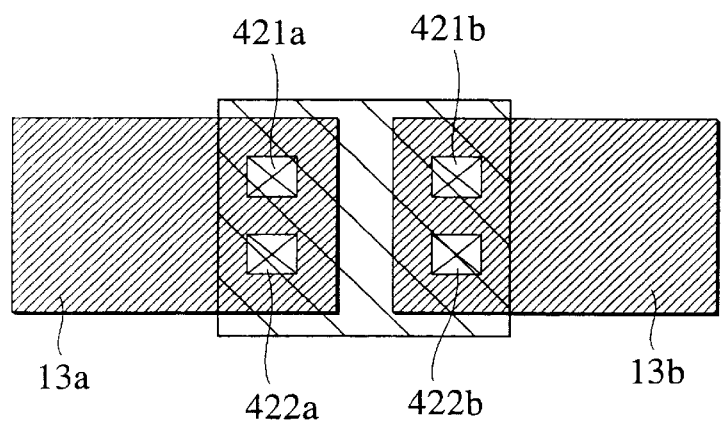
FIG. 7B is a schematic plan view corresponding to the sectional view shown in FIG. 7A.

FIG. 7A and FIG. 7B illustrate still another example of the structure of the dummy interconnection related to the first embodiment of the present invention. FIG. 7A is a schematic cross sectional view of the structure around the fuse body and FIG. 7B is a schematic plan view of the same part. In the structures shown in FIGS. 6A–6B, the terminal portions of the first and second fuse wiring 13a, 13b are provided with two first connecting members 411a, 412a and two second connecting members 411b, 412b arranged along the extended direction of the first and second fuse wirings 13a and 13b, respectively. But, plural first contact plugs 421a, 422a, . . . and plural second contact plugs 421b, 422b, . . . may be arranged in the vertical direction to the extended direction of the first and second fuse wirings 13a and 13b as shown in FIG. 7A and FIG. 7B.

Figure 8:
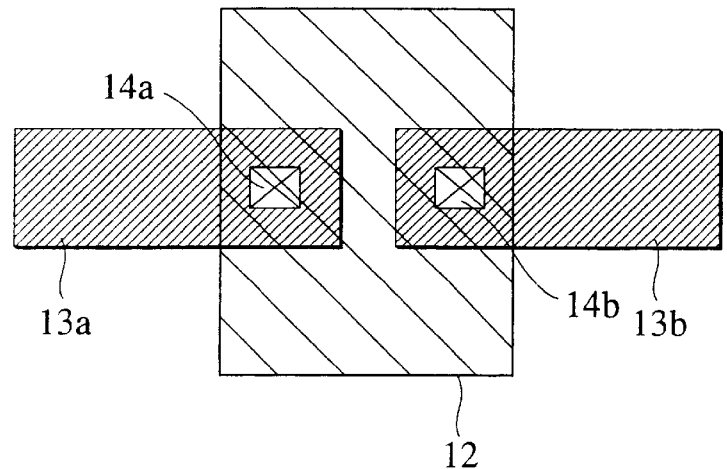
FIG. 8 is a schematic plan view showing still another example of the configuration around the fuse body.

FIG. 8 illustrates a schematic plan view of still another example of the structure of the dummy interconnection related to the first embodiment of the present invention. In the structures shown in FIGS. 5A–7B, rectangle fuse bodies having long sides arranged in the extended direction of the first and second fuse wirings 13a and 13b are shown. But, a rectangle fuse body having long sides arranged in the vertical direction to the extended direction of the first and second fuse wirings 13a and 13b can be employed as shown in FIG. 8.

Also in the structures illustrated in FIGS. 5A–7B and 8, the maximum dimension, or the longer side length of the fuse body 12 is set to a length not shorter than the gap "A" between the first terminal portion of the first fuse wiring 13a and the second terminal portion of the second fuse wiring 13b and also not longer than the diameter of the laser beam. Due to this arrangement, heat generated by the laser beam cannot be transported away via the dummy interconnection in its longitudinal direction. Moreover, since the cross sectional areas of the first and second contact plugs 14a, 14b are small, the heat at the time of blowing is hard to be transmitted to the conductive wiring 13a, 13b. For this reason, the heat generated by the laser beam will be concentrated only on the fuse body 12, and this facilitates fuse-blowing.

Figure 9A:
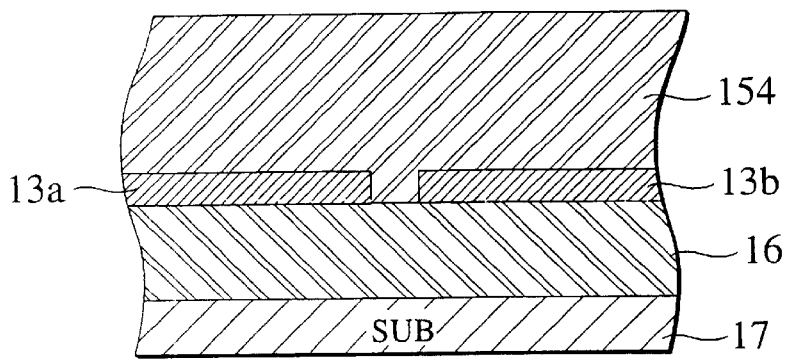
FIG. 9A–FIG. 9H are process sectional views for describing another method of manufacturing the semiconductor device related to the modification of the first embodiment of the present invention.

FIG. 9A–FIG. 9H are process sectional views for describing another method of manufacturing the dummy interconnections related to the modification of the first embodiment of the present invention. The fuse circuit, or the array of the dummy interconnections related to the modification of the first embodiment can be manufactured as follows:

(a) Firstly, an insulating layer 16 of 100 nm to 800 mn thickness, desirably, 300 nm to 400 nm is formed on a silicon substrate 17 by thermal oxidation, etc. On this insulating layer 16, as shown in FIG. 9A, the first fuse wiring 13a with the first terminal portion and the second fuse wiring 13b, which has the second terminal portion made apart by a given distance "A" from the first terminal portion and is arranged along the same direction as extension of the first fuse wiring 13a, are formed by the same process already prescribed with FIG. 4A. The thickness of the first fuse wiring 13a and the second fuse wiring 13b can be 150 nm to 300 nm, desirably, about 200 nm.

Figure 9B:
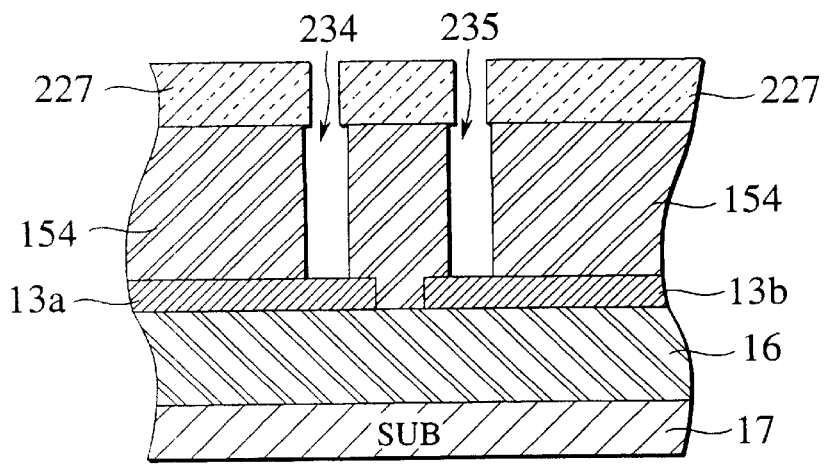

(b) Next, as shown in FIG. 9B, the first interlayer insulating film 154 such as $SiO_2$, PSG, or BPSG film, etc. is deposited on the first and second fuse wiring 13a, 13b by means of CVD method, etc. The thickness of the first interlayer insulating film 154 can be 400 nm to 1300 nm, desirably, about 800 nm. Then, as shown in FIG. 9B, a mask pattern 227 made of photoresist is delineated by means of photolithography. And then, using this mask pattern 227, contact holes 234, 235 are dug in the first interlayer insulating film 154 by RIE method so as to partly expose the first terminal portion of the first fuse wiring 13a and the second terminal portion of the second fuse wiring 13b.

Figure 9C:
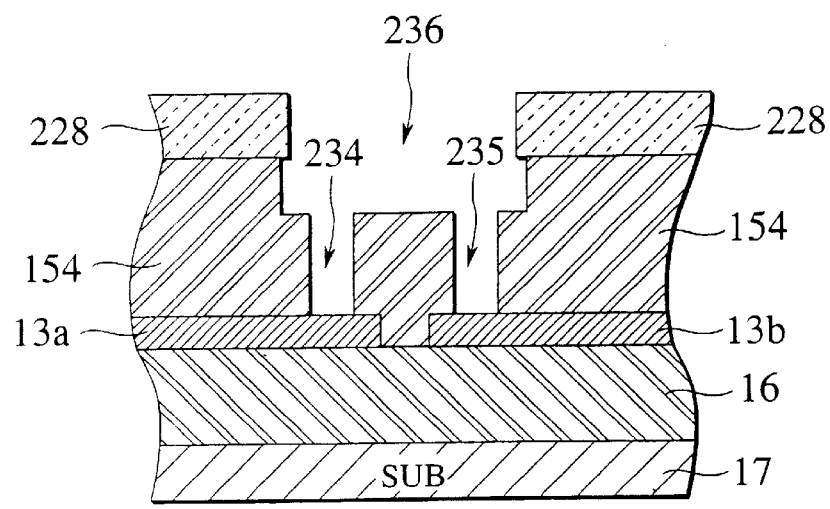

(c) Next, as shown in FIG. 9C, a mask pattern 228 made of photoresist is delineated by means of photolithography. And then, using this mask pattern 228, an window 236 is dug in the first interlayer insulating film 154 to overlap with the positions of contact holes 234, 235 by RIE method so as to form a concave at upper side of the contact holes 234, 235.

Figure 9D:
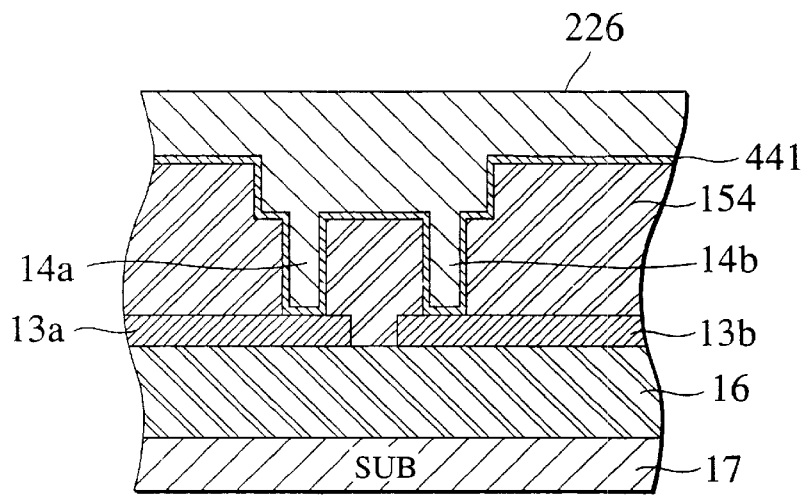

(d) A conductive material is buried into these contact holes 234, 235 and the concave 236. Firstly, as shown in FIG. 9D, a thin niobium (Nb) film is deposited in the bottom and sidewall of the contact holes 234, 235 and the concave 236 by means of sputtering, vacuum evaporation, or CVD method, etc. And a rather thick aluminum-copper (Al—Cu) is deposited thereon to form a metallic film 226 so as to excessively bury the contact holes 234, 235 and the concave 236. The metallic film 226 is allowed to be formed at the same time as a metallization process of the second level interconnections of the memory cell array.

Figure 9E:
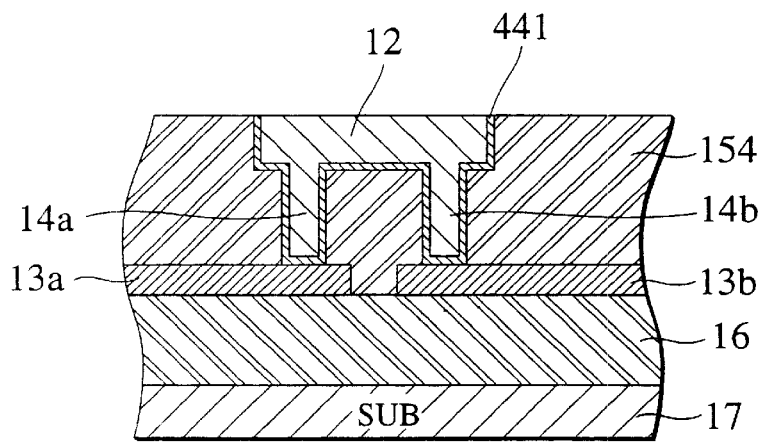

(e) After that, an excess metallic film 226 on the surface of the first interlayer insulating film 154 is removed as shown in FIG. 9E by flattening the surface with CMP, etc. As a result, the first connecting member 14a and second connecting member 14b are formed on the first and second terminal portions 13a and 13b respectively.

Figure 9F:
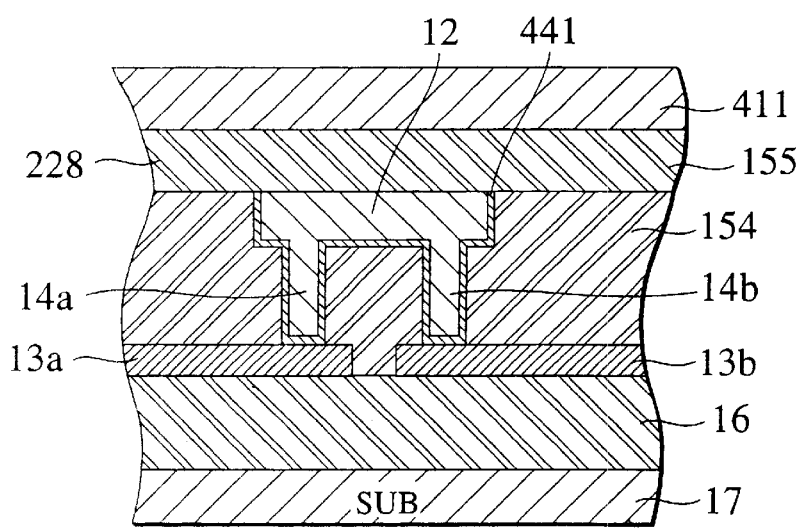
Figure 9G:
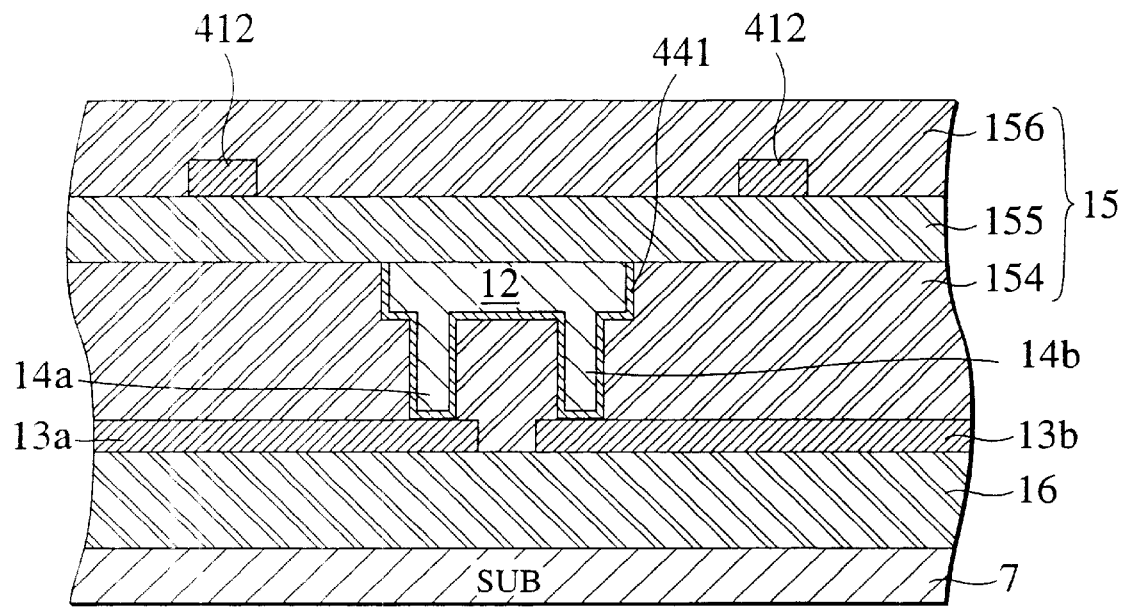

(f) Then, as shown in FIG. 9F, a second interlayer insulating film 155 such as $SiO_2$, PSG, BPSG, or $Si_3N_4$ film, etc. is deposited by CVD method, etc. on the fuse body 12. Further, third level interconnections or a tri-layer metallic film consisting of Al—Cu film sandwiched by upper and lower Ti/TiN films employed in the memory cell array are formed on this second interlayer insulating film 155 as shown in FIG. 9F.

Figure 9H:
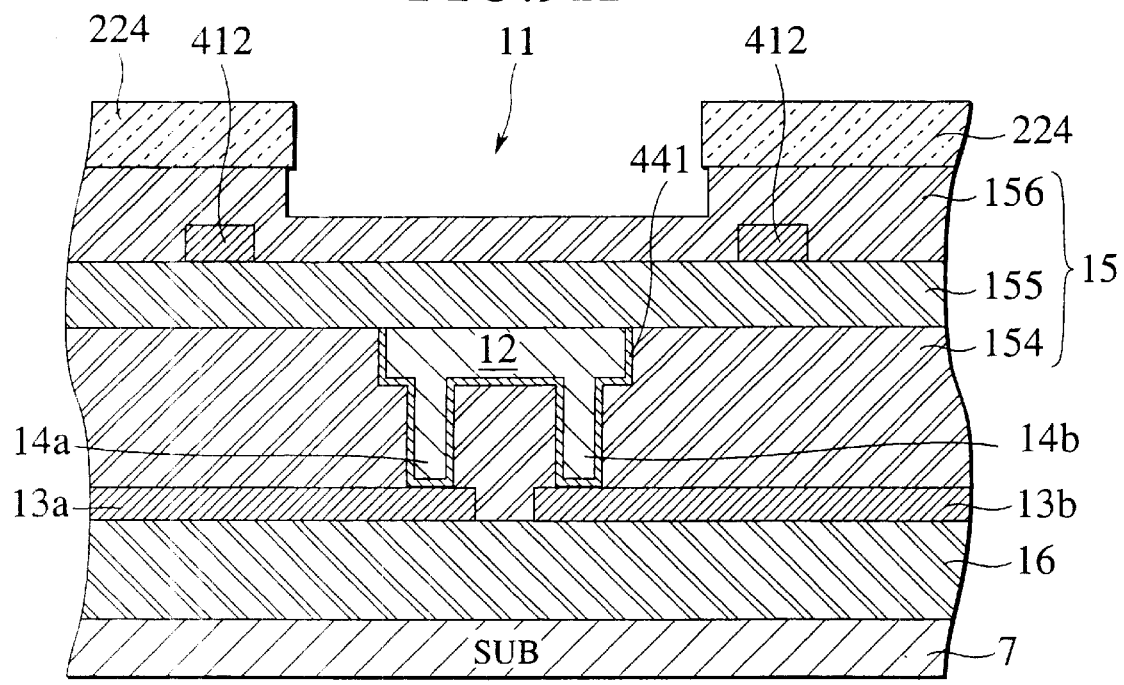

(g) And then, tri-layer metallic film 411 is delineated by an etching such as the RIE employing the photoresist mask pattern. Then, as shown in FIG. 9F, further thereon, a third interlayer insulating film 156 such as $SiO_2$, PSG, BPSG, or $Si_3N_4$ film is deposited by CVD method, etc. Next, as shown in FIG. 9H, a mask pattern of polyimide 224 is delineated by photolithography. And then, a concave shaped fuse window 11 is formed by selectively etching the third insulating films 156 by RIE method using the polyimide 224 as a mask. Then, the fuse(s) 12 determined to be blown off is (are) selectively irradiated through the fuse window 11 with laser beam such as YLF laser, YAG laser, excimer laser, etc.

Second Embodiment

Figure 10A:
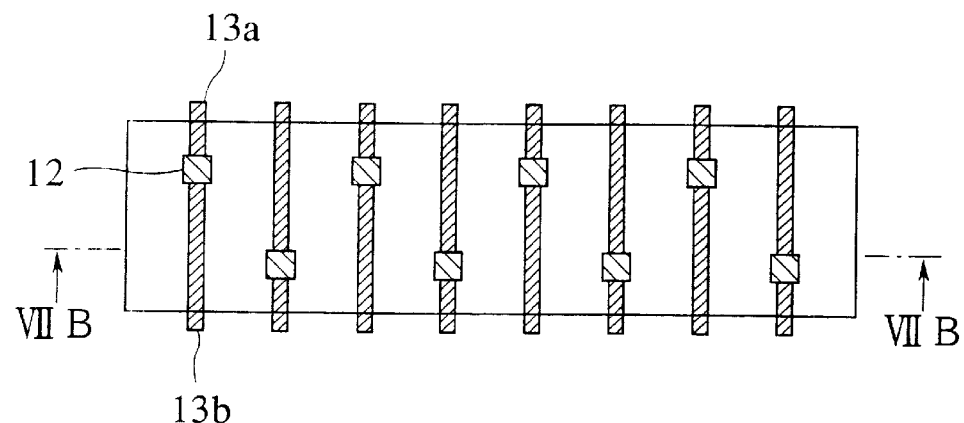
FIG. 10A is a schematic plan view of a fuse circuit of the semiconductor circuit related to the second embodiment in accordance with the invention.
Figure 10B:
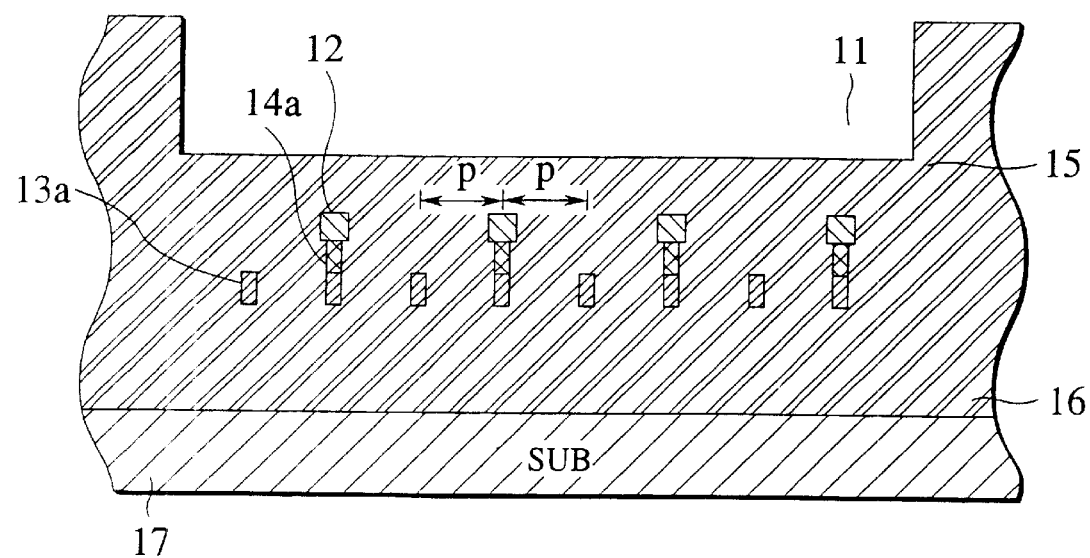
FIG. 10B is a schematic sectional view taken along line VII B-VII B in FIG. 10A.

Next, a structure of the fuse circuit, or a array of dummy interconnections related to the second embodiment of the present invention will be described referring to FIG. 10A and FIG. 10B. FIG. 10A is a schematic plan view of the fuse circuit, and FIG. 10B is a schematic cross sectional view taken along line VII B-VII B in FIG. 10A. Here, since a basic configuration and its manufacturing method are basically same as those in the first embodiment, the description is omitted here. However, a plurality of the fuse bodies 121, 122, . . . , 128, . . . are not distinguished from each other but are expressed by a single generic reference numeral as fuse bodies 12. Similarly, the first fuse wirings 131a, 132a, . . . , 138a, . . . are expressed by a single generic reference numeral as the first fuse wirings 13a, and the second fuse wirings 131b, 132b, . . . , 138b, . . . are expressed as the second fuse wirings 13b.

In a second embodiment of the present invention, as shown in FIG. 10A, fuse bodies 12 in adjacent dummy interconnections are arrayed so as not to be aligned on a single line perpendicular to the longitudinal direction of the dummy interconnections but are alternately arrayed in a staggered planar configuration. Namely, each fuse of the plural dummy interconnections is alternately arranged on a first and a second lines orthogonal to the longitudinal direction of the dummy interconnections. Looking at this arrangement in FIG. 10B, the fuse bodies 12 are arranged so that the most adjacent parts of the dummy interconnections adjacent to the fuse body 12 are the fuse wiring 13a or 13b in a lower level than the fuse body 12.

According to the semiconductor device related to the second embodiment of the present invention, as is the case with the first embodiment of the present invention, fuse-blowing process becomes easier and in addition, even if the irradiating position becomes more or less misaligned, the most adjacent parts of the adjacent dummy wirings are the fuse wirings 13a or 13b in the under-level, therefore, the fuse-blowing will not cause damage to the fuse bodies 12 of the adjacent dummy interconnections to be scheduled not blown off. Therefore, a manufacturing yield of the product can be improved. Moreover, since there is little possibility to cause damage to non-blowing part even if the fuse pitch "p" is narrowed, a fuse area can be reduced. Thus, this arrangement contributes to reduction in a size of the semiconductor chip.

Third Embodiment

Next, a structure of the fuse circuit, or a array of dummy interconnections related to the third embodiment of the present invention will be described referring to FIG. 11A–FIG. 11C, FIG. 12A, FIG. 12B, and FIG. 13. Here, since a basic configuration and its manufacturing method are the same as those in the first embodiment, the description is omitted here. However, similar to the second embodiment, the respective fuse bodies 121, 122, ..., 128, ... are not distinguished from each other but are expressed by a single generic reference numeral as fuse bodies 12. Similarly, the first fuse wirings 131a, 132a, ..., 138a, ... are expressed by a single generic reference numeral as the first fuse wirings 13a, and the second fuse wirings 131b, 132b, ..., 138b, ... are expressed as the second fuse wirings 13b.

Figure 11A:
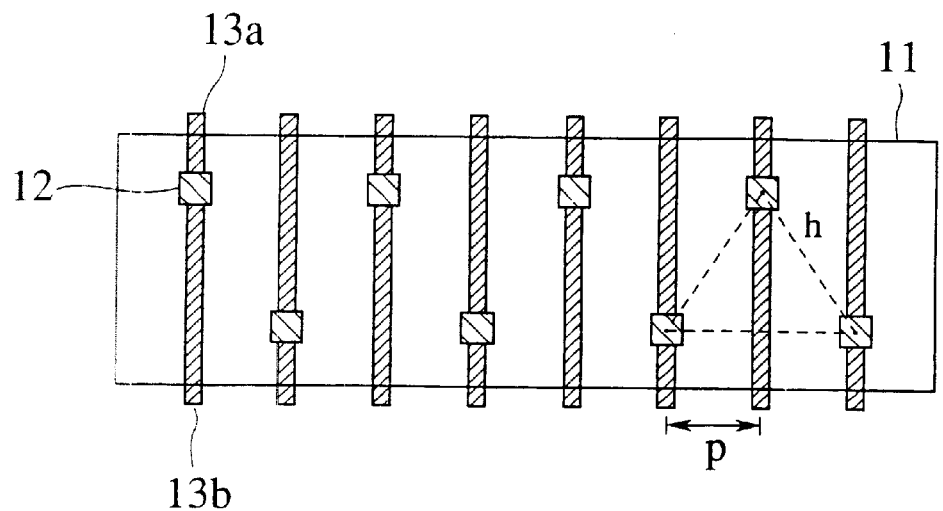
FIG. 11A is a schematic plan view of a fuse circuit of the semiconductor circuit related to the third embodiment in accordance with the invention.

FIG. 11A is a schematic plan view of a fuse circuit of the semiconductor device related to a third embodiment of the present invention. According to the fuse circuit in accordance with the third embodiment of the present invention, the fuse bodies 12 are periodically arranged so that the centers of the respective fuse bodies 12 are positioned at each vertex of regular triangles having a side length "h". And, each of the plural dummy interconnections is arranged with pitch of "p", in parallel with one of sidewalls of the fuse window 11. Namely, assuming that a diameter of laser beam used for fuse-blowing, the regular triangles are configured so as to satisfy a relationship:

$$h=2p \quad (1)$$

$$h>d \quad (2)$$

For example, if a pitch "p" is 3.6 µm, a beam diameter d of laser light can be selected 6 µm. If a pitch "p" is 1.8 µm, a beam diameter d of laser light can be selected 3 µm. In the case of such a regular triangle arrangement, it is possible to keep a minimum distance "h" between most adjacent fuse bodies uniform with respect to all the fuse bodies. Further, the fuse pitch "p" is reducible with this regular triangle arrangement held as it is. Therefore, as is the case with the first embodiment of the present invention, not only fuse-blowing is facilitated but also adjacent fuse bodies are not damaged. In addition, high-integration of fuse bodies and reduction of fuse area can be achieved.

Figure 11B:
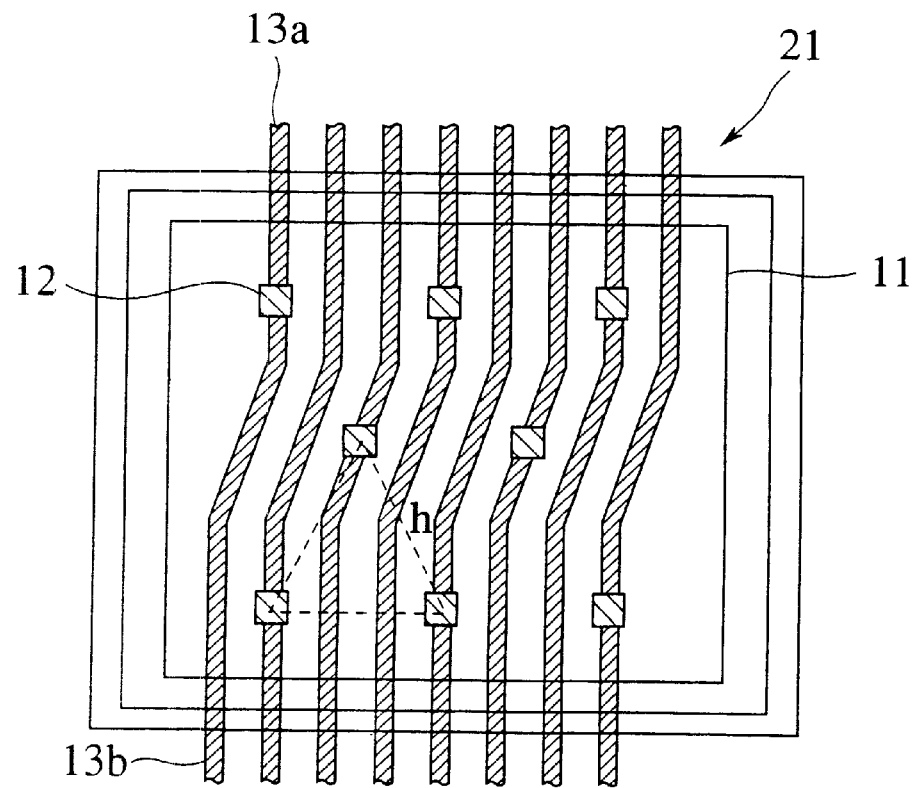
FIG. 11B is a schematic plan view showing a fuse area where fuse bodies are laterally arranged in three rows so as to form regular triangles.
Figure 11C:
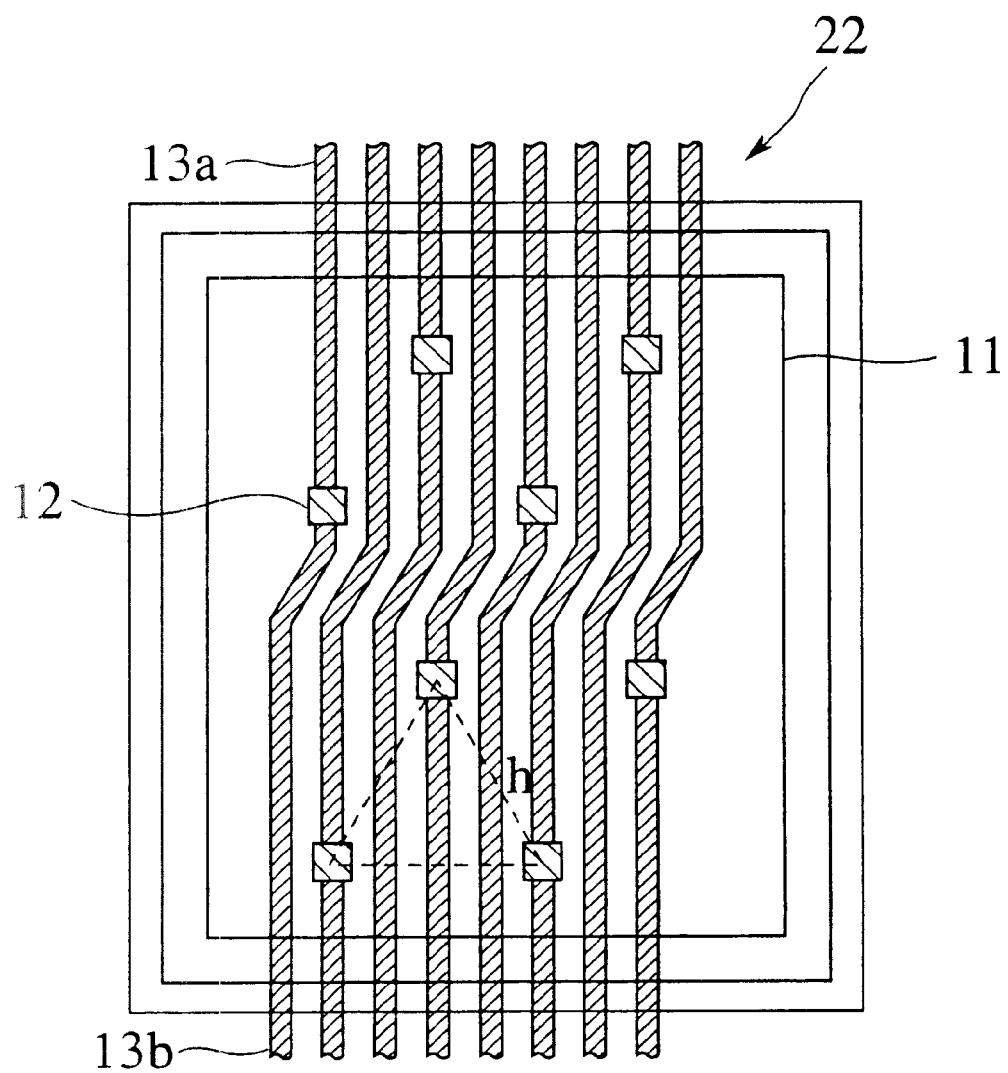
FIG. 11C is a schematic plan view showing a fuse area where fuse bodies are laterally arranged in four rows so as to form regular triangles.

Moreover, as shown in FIG. 11B and FIG. 11C, dummy interconnections each can be arranged so as to have two or more bending parts. Thus, in the semiconductor device related to the third embodiment of the present invention, the shape of each fuse area can be deformed, therefore, selectivity and degree of freedom in arrangements of other circuits around the fuse area can be enhanced. As an example, FIG. 11B illustrates a fuse area 21 where fuse bodies are arranged in three rows in a lateral configuration, and FIG. 11C illustrates a fuse area 22 where fuse bodies are arranged in four rows in a lateral configuration. Thus, in the semiconductor device related to the third embodiment of the present invention, it is possible to arrange three fuse bodies, which are periodically selected from the array of dummy interconnections, so as to be positioned at each vertex of a regular triangle.

Figure 12A:
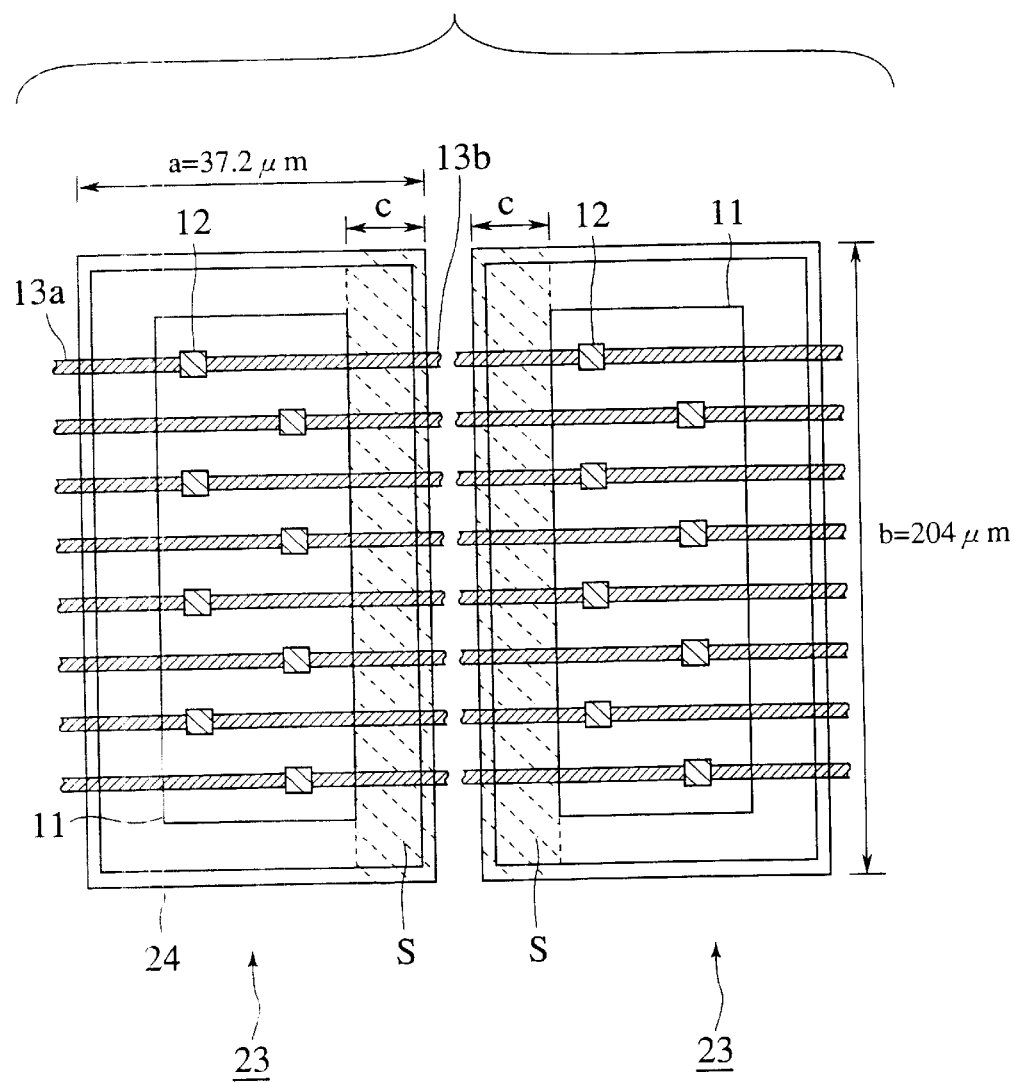
FIG. 12A is a schematic plan view showing a configuration of split fuse areas.
Figure 12B:
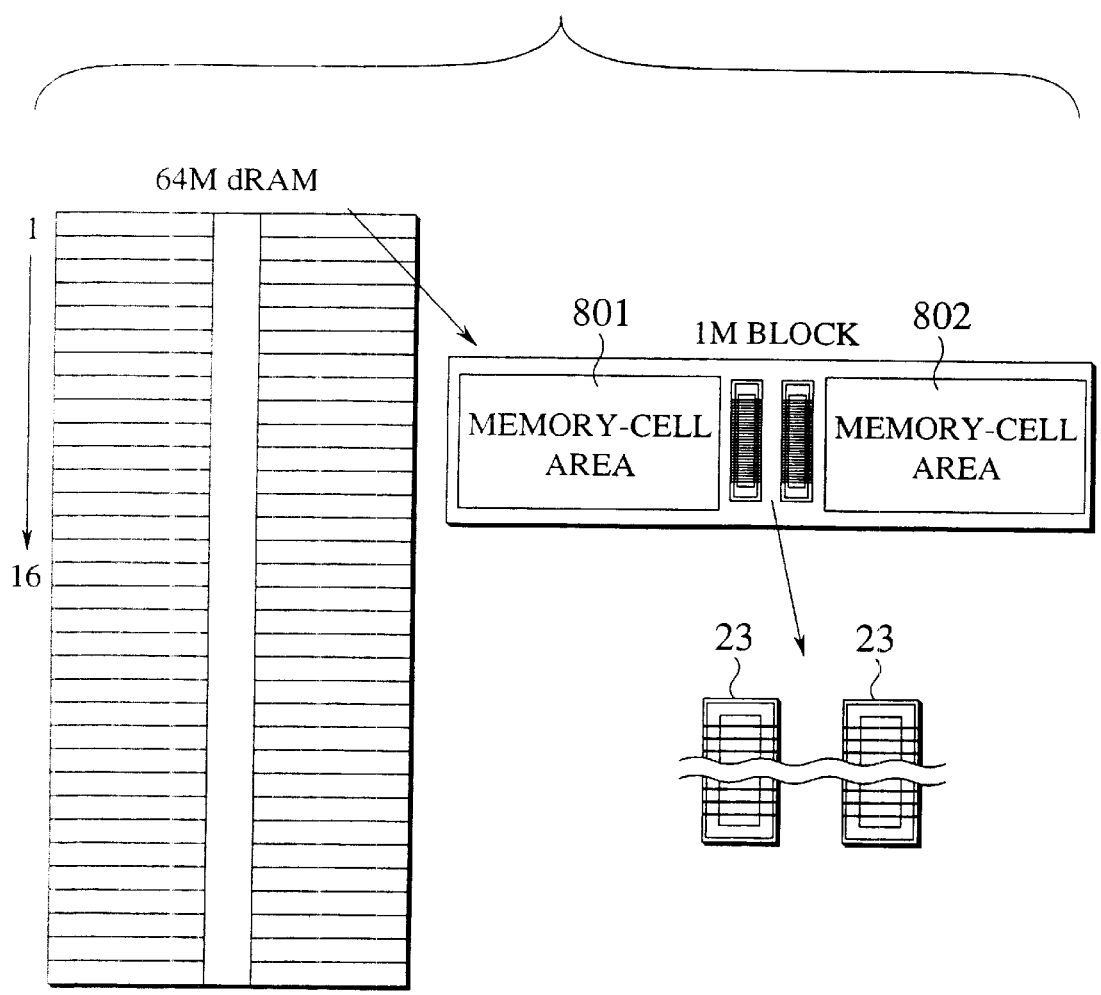
FIG. 12B is a conceptual schema where a fuse circuit of FIG. 12A is applied to 64 Mb DRAM.

Net, an application of the third embodiment of the present invention to 64 Mb DRAM is described. FIG. 12A shows an arrangement of two fuse areas, each of which is provided with two rows of fuse bodies, to form total four rows of fuse bodies. The fuse area 23 shown in FIG. 12A has a guard ring 24 arranged in the periphery and fuse windows 11 arranged on the planar pattern in this guard ring 24, and a plurality of dummy interconnections 13a, 13b are also formed to cross over the guard ring and fuse windows. The guard ring 24 is comprised of a ring form of a diffusion layer formed at the top surface of and in the semiconductor substrate, a first level, a second level, and a third level metallic wirings (interconnections) formed on the diffusion layer, and contact plugs interconnecting them. Then, when this geometry is applied to 64 Mb DRAM, the configuration becomes as shown in FIG. 12B. In FIG. 12B, two fuse areas 23 (size: a×b=37.2 µm×204 µm) containing 40 pieces of fuse bodies in each 1 Mb block exist between memory-cell areas 801 and 802. Then, 64 pieces of such 1 Mb-blocks are arranged.

If the fuse areas are split into two as shown in FIG. 12A, wiring routes (wiring channels) around the fuse areas are allowed to have a freedom to some extent. Moreover, three or more fuse areas can exist in one block.

Figure 13:
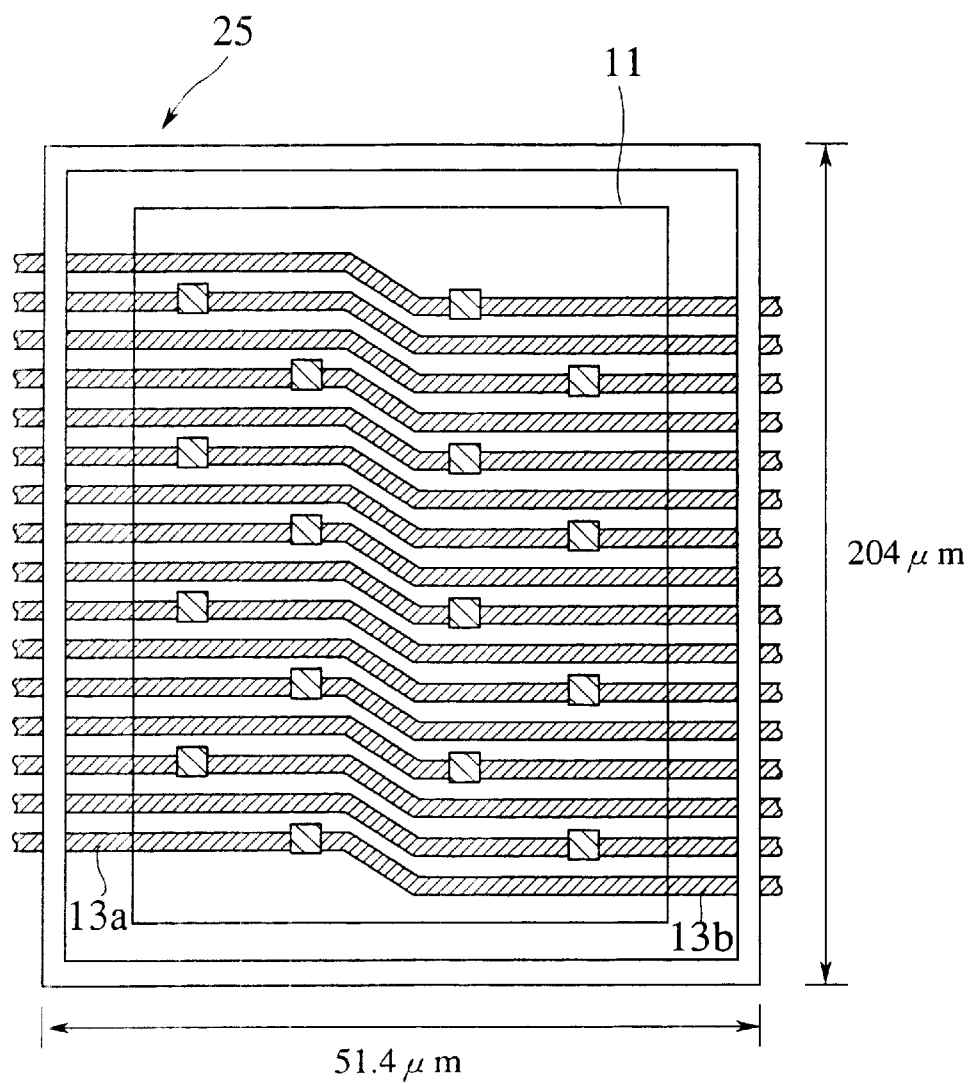
FIG. 13 is a schematic plan view where two fuse areas are unified.

Further, as shown in FIG. 13, it is also possible to integrate two fuse areas into one area. The fuse area illustrated in FIG. 13 includes a guard ring 25 arranged in the peripheral part and fuse windows 11 arranged on the planar pattern within this guard ring 25, and a plurality of dummy interconnections 13a, 13b traverse the guard ring 25 and the fuse windows 11. When a block has two fuse areas as shown in FIG. 12A, the area "S" shown by (width "c")×(length "b")×(two rows) is wasteful. To be more specific, The area S from the edge of the fuse windows 11 shown in FIG. 12A up to the guard ring 25 calculated as:

$$S=(\text{width } 11.5 \text{ µm})\times(\text{length } 204 \text{ µm})\times(\text{two rows})=4692 \text{ µm}^2$$

is unused. Contrasted with this, when two fuse areas are integrated into one area as shown in FIG. 13, the area "S" can be eliminated in each block.

Therefore, a total of 4692 µm²×64 blocks=300288 µm² wasteful area can be eliminated. Therefore, reduction not only in fuse area but also in chip size is achievable. As an example, a total size of the two fuse areas in FIG. 12A becomes 37.2 µm×204 µm×2=15117.6 µm², while a total size in FIG. 13 becomes 51.4 µm×204 µm=10485.6 µm² and a 30% reduction is achievable in size.

Moreover, it is selectable depending on a circuit to be applied whether a split configuration of a fuse circuit is adopted as shown in FIG. 12A or an integrated circuit is adopted as shown in FIG. 13.

Other Embodiments

Various modifications will become possible for those skilled in the art after receiving the teachings of the present disclosure without departing from the scope thereof.

For example, in the first embodiment, tri-level metal wiring architecture is explained, in which the first fuse wiring and the second fuse wiring are formed at the same time as the metallization process of the first level interconnections of the memory cell array. And, the fuse bodies are formed at the same time as the metallization process of the second level interconnections of the memory cell array. However the present invention is applicable to four-level, five-level, . . . , metal wiring architectures.

Figure 14:
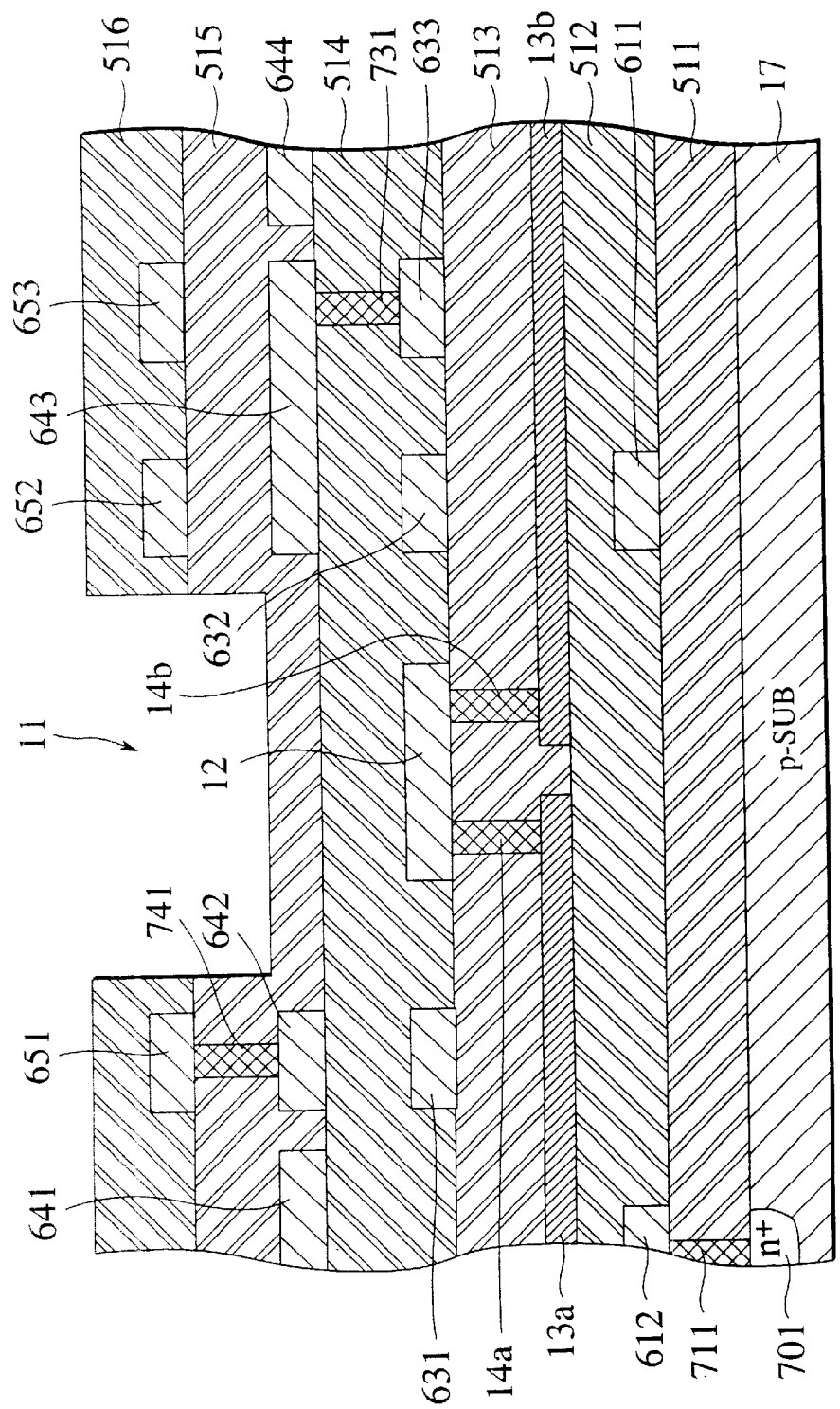
FIG. 14 is a schematic plan view of a semiconductor device related to other embodiment in accordance with the present invention.

FIG. 14 is a schematic sectional view showing a configuration of dummy interconnections of a semiconductor device related to other embodiment of the present invention. In FIG. 14, the first fuse wiring 13a and the second fuse wiring 13b are formed at the same time as the second level interconnections of the memory cell array. And, the fuse body 12 is formed at the same time as the third level interconnections 631, 632, 633 of the memory cell array.

Namely, $n^+$ diffused region 701 is formed at the surface of and in a p-type silicon substrate 17, and an insulating layer 511 such as the field oxide film is disposed on the p-type silicon substrate 17, and on this insulating layer 511, the first level wirings 611 and 612 are disposed. And on the first level wirings 611 and 612, the first interlayer insulating film 512 such as $SiO_2$, PSG, or BPSG film, etc. is disposed. On the first interlayer insulating film 512, a pair of fuse wirings consisting of the first fuse wiring 13a and the second fuse wiring 13b, each is apart by a given distance is arranged. The first fuse wiring 13a and the second fuse wiring 13b are formed as the second level interconnections. On the first fuse wiring 13a and the second fuse wiring 13b, the second interlayer insulating film 513 such as $SiO_2$, PSG, or BPSG film, etc. is arranged. A conductive material is buried into contact holes dug in the second interlayer insulating film 513 to form the first connecting member (contact plug) 14a and second connecting member (contact plug) 14b, on the terminal portions of first and second terminal portions 13a and 13b, respectively.

Further, on the second interlayer insulating film 513, a rectangular fuse body 12 having side length equal to or less than a laser beam diameter (to be used in the blown-off process) is disposed so as to connect the first and second connecting members (contact plugs) 14a, 14b mutually, as well as interconnections 631, 632 and 633 as the third level interconnections. On the fuse body 12, and interconnections 631, 632 and 633, a third interlayer insulating film 514 such as $SiO_2$, PSG, BPSG, or $Si_3N_4$ film, etc. is disposed. Further, fourth level interconnections 641, 642, 643 and 644 are disposed on this third interlayer insulating film 514. Then, further thereon, a fourth interlayer insulating film 515 such as $SiO_2$, PSG, BPSG, or $Si_3N_4$ film is disposed. Still further, fifth level interconnections 651, 652 and 653 are disposed on the fourth interlayer insulating film 515. Then, further thereon, a top interlayer insulating film 516, or passivation film such as $SiO_2$, PSG, BPSG, $Si_3N_4$ film, or polyimide film is disposed. Between the fifth and fourth interconnections, and between fourth and third interconnections, a contact plug 741 and a contact plug 731 are arranged, respectively. And between fist interconnection and the $n^+$ diffused 701, a contact plug 711 is formed. Further, a concave shaped fuse window 11 is formed penetrating fifth interlayer insulating film 516 and digging the fourth interlayer insulating film 515 so as to blown off selectively desired fuse body, by selectively irradiating through the fuse window 11 with laser beam such as YLF laser, YAG laser, excimer laser, etc.

In FIG. 14, the fifth level interconnections 651, 652, 653 may be omitted depending on the circuit designs of the objective semiconductor devices.

What is claimed is:

1. A semiconductor device having a plurality of memory-cell blocks, each memory-cell block comprising a pair of memory-cell areas and a fuse area sandwiched between the memory-cell areas, the fuse area comprising:
    a guard ring arranged in a peripheral part of the fuse area;
    a fuse window arranged within said guard ring;
    a plurality of dummy interconnections being arranged in parallel with each other, traversing said guard ring and said fuse window, each dummy interconnection comprising:
        a first fuse wiring having a first terminal portion;
        a second fuse wiring having a second terminal portion with a given distance apart from said first terminal portion, being arranged along the same direction as a longitudinal direction of said first fuse wiring, configured such that said given distance is measured along the longitudinal direction;
        an interlayer insulating film disposed on said first and second fuse wirings;
        a first pillar like contact plug burying a first contact hole formed in said interlayer insulating film configured such that the first pillar like contact plug is arranged on and contacted to said first terminal portion;
        a second pillar like contact plug burying a second contact hole formed in said interlayer insulating film configured such that the second pillar like contact plug is arranged on and contacted to said second terminal portion; and
        a fuse body configured to be arranged in a topology such that the fuse body is alternately arranged on at least three rows, the rows run in the direction perpendicular to the longitudinal direction of said first and second fuse wirings, and the fuse body is being disposed on said first and second pillar like contact plugs so as to electrically connect said first and second pillar like contact plugs wit each other, having a length not longer than a diameter of a laser beam used for blowing off the fuse body.

2. The semiconductor device of claim 1, wherein each of said fuse bodies is alternately arranged on first to fourth rows.

3. A semiconductor device having a plurality of memory-cell blocks, each memory-cell block comprising a pair of memory-cell areas and a fuse area disposed adjacent to one of the memory-cell areas, the fuse area comprising:
    a guard ring arranged in a peripheral part of the fuse area;
    a fuse window arranged within said guard ring;
    a plurality of dummy interconnections being arranged in parallel wit each other, traversing said guard ring and said fuse window, each dummy interconnection comprising:
        a first fuse wiring having a first terminal portion;
        a second fuse wiring having a second terminal portion with a given distance apart from said first terminal portion being arranged along the same direction as a longitudinal direction of said first fuse wiring, configured such that said given distance is measured along the longitudinal direction; an interlayer insulating film disposed on said first and second fuse wirings;
        a first pillar like contact plug burying a first contact hole formed in said interlayer insulating film configured such that the first pillar like contact plug is arranged on and contacted to said first terminal portion;
        a second pillar like contact plug burying a second contact hole formed in said interlayer insulating film configured such that the second pillar like contact plug is arranged on and contacted to said second terminal portion; and a fuse body configured to be arranged in a topology such that the fuse body is alternately arranged on at least three rows, the rows run in the direction perpendicular to the longitudinal direction of said first and second fuse wirings, and the fuse body is being disposed on said first and second pillar like contact plugs so as to electrically connect said first and second pillar like contact plugs with each other, having a length not longer than a diameter of a laser beam used for blowing off the fuse body.

4. The semiconductor device of claim 3, wherein each of said fuse bodies is alternately arranged on first to fourth rows.

* * * * *